(12) United States Patent
Papanikolaou et al.

(10) Patent No.: US 8,578,319 B2
(45) Date of Patent: Nov. 5, 2013

(54) METHOD AND APPARATUS FOR DESIGNING AND MANUFACTURING ELECTRONIC CIRCUITS SUBJECT TO PROCESS VARIATIONS

(75) Inventors: Antonis Papanikolaou, Leuven (BE); Miguel Miranda, Kessel-lo (BE); Francky Catthoor, Temse (BE); Hua Wang, Leuven (BE)

(73) Assignee: IMEC, Leuven (BE)

( * ) Notice: Subject to any disclaimer, the term of this patent is extended or adjusted under 35 U.S.C. 154(b) by 490 days.

(21) Appl. No.: 11/095,494

(22) Filed: Mar. 30, 2005

(65) Prior Publication Data

US 2005/0235232 A1    Oct. 20, 2005

Related U.S. Application Data

(60) Provisional application No. 60/612,427, filed on Sep. 23, 2004.

(30) Foreign Application Priority Data

Mar. 30, 2004 (GB) .................................. 0407070.2

(51) Int. Cl.
G06F 17/50         (2006.01)

(52) U.S. Cl.
USPC ........................... 716/132; 716/101; 716/113

(58) Field of Classification Search
USPC ........... 716/1, 4–6, 101, 113, 132; 700/33, 97
See application file for complete search history.

(56) References Cited

U.S. PATENT DOCUMENTS 5,539,652 A   7/1996  Tegethoff
5,802,349 A * 9/1998  Rigg et al. ......................... 716/2

(Continued)

FOREIGN PATENT DOCUMENTS

EP    1467294        10/2004
JP    2002 329789    11/2002

OTHER PUBLICATIONS

Brockmeyer, E. et al., "Systematic Cycle Budget versus System Power Trade-off: a New Perspective on System Exploration of Real-time Data-dominated Applications", 2000, ISLPED '00, Proceedings of the 2000 International Symposium on Low Power Electronics and Design on Jul. 26-27, 2000, pp. 137-142.*

(Continued)

*Primary Examiner* — Thuan Do
(74) *Attorney, Agent, or Firm* — Knobbe Martens Olson & Bear LLP

(57) ABSTRACT

Methods and apparatus are described in which, at design-time a thorough analysis and exploration is performed to represent a multi-objective "optimal" trade-off point or points, e.g. on Pareto curves, for the relevant cost (C) and constraint criteria. More formally, the trade-off points may e.g. be positions on a hyper-surface in an N-dimensional Pareto search space. The axes represent the relevant cost (C), quality cost (Q) and restriction (R) criteria. Each of these working points is determined by positions for the system operation (determined during the design-time mapping) for a selected set of decision knobs (e.g. the way data are organized in a memory hierarchy). The C-Q-R values are determined based on design-time models that then have to be "average-case" values in order to avoid a too worst-case characterization. At processing time, first a run-time BIST manager performs a functional correctness test, i.e. checks all the modules based on stored self-test sequences and "equivalence checker" hardware. All units that fail are deactivated (so that they cannot consume any power any more) and with a flag the run-time trade-off controllers, e.g. Pareto controllers, are informed that these units are not available any more for the calibration or the mapping. At processing time, also a set of representative working points are "triggered" by an on-chip trade-off calibration manager, e.g. a Pareto calibration manager, that controls a set of monitors which measure the actual C-Q-R values and that calibrates the working points to their actual values. Especially timing monitors require a careful design because correctly calibrated absolute time scales have to be monitored.

14 Claims, 36 Drawing Sheets

(56) References Cited

U.S. PATENT DOCUMENTS

| | | | |
|---|---|---|---|
| 5,883,814 A * | 3/1999 | Luk et al. ........................ | 716/2 |
| 6,343,366 B1 | 1/2002 | Okitaka et al. | |
| 6,449,761 B1 * | 9/2002 | Greidinger et al. ............ | 716/11 |
| 6,477,685 B1 * | 11/2002 | Lovelace ........................ | 716/4 |
| 6,826,733 B2 * | 11/2004 | Hathaway et al. .............. | 716/2 |
| 6,957,400 B2 * | 10/2005 | Liu et al. ........................ | 716/1 |
| 7,003,738 B2 * | 2/2006 | Bhattacharya et al. ......... | 716/1 |
| 7,107,551 B1 * | 9/2006 | de Dood et al. ................ | 716/2 |
| 7,124,377 B2 * | 10/2006 | Catthoor et al. ................ | 716/2 |
| 7,191,112 B2 * | 3/2007 | Demler et al. .................. | 703/14 |
| 7,234,126 B2 * | 6/2007 | Catthoor et al. ................ | 716/18 |
| 7,747,422 B1 * | 6/2010 | Sisley ............................. | 703/13 |
| 2001/0052106 A1 * | 12/2001 | Wuytack et al. ................ | 716/2 |
| 2002/0099756 A1 * | 7/2002 | Catthoor et al. ................ | 709/102 |
| 2003/0085888 A1 | 5/2003 | Lafruit | |
| 2004/0049744 A1 * | 3/2004 | Sherstyuk et al. .............. | 716/2 |
| 2004/0122642 A1 | 6/2004 | Scheffer | |
| 2004/0216072 A1 * | 10/2004 | Alpert et al. ................... | 716/13 |
| 2005/0044515 A1 | 2/2005 | Acar et al. | |
| 2005/0138578 A1 * | 6/2005 | Alpert et al. ................... | 716/2 |
| 2005/0144576 A1 | 6/2005 | Furuta et al. | |

OTHER PUBLICATIONS

Givargis, T. et al., "System-level Exploration for Pareto-optimal Configurations in Parameterized Systems-on-a-chip", 2001, IEEE Press, Proceedings of the 2001 IEEE/ACM international conference on Computer-aided design, pp. 25-30.*

Chang et al., "The Certainty of Uncertainty: Randomness in Nanometer Design" (2004) Proc. of PATMOS, pp. 36-47.

Abas et al., "Design of Sub-10-Picoseconds On-Chip Time Measurement Circuit", (2004) Proc. DATE, vol. 2, pp. 804-809.

EP Search Report for EP Appl. No. 05447072.9-2201, Aug. 4, 2005.

Death, Taxes and Failing Chips by Chandu Visweswariah; IBM Thomas J. Watson Research Center, Jun. 2002, pp. 343-347.

Office Action from EP 05 447 072.9, dated Aug. 21, 2009.

Man, De H. "Connecting e-dreams to deep-submicron realities" Lecture Notes in Computer Science, Springer Verlag, Berlin; De, vol. 3254, Jan. 1, 2004, p. 1, XP002356064 ISSN: 0302-9743.

Brockmeyer et al., "Systematic Cycle Budget versus System Power Trade-off: a New Perspective on System Exploration of Real-time Data-dominated Applications", 2000, ISLPED '00, Proceedings of the 2000 International Symposium on Low Power Electronics and Design on Jul. 26-27, 2000, pp. 137-142.

Givargis et al., "System-level Exploration for Pareto-optimal Configurations in Parameterized Systems-on-a-chip", 2001, IEEE Press, Proceedings of the 2001 IEEE/ACM international conference on Computer-aided design, pp. 25-30.

Papanikolaou et al., "Interconnect Exploration for Future Wire Dominated Technologies", invited paper at $4^{th}$ ACM/IEEE Intnl. Wsh. on System Level Interconnect Prediction, San Diego, CA, Apr. 2002.

Papanikolaou et al., "Global interconnect trade-off for technology over memory modules to application level: case study", $5^{th}$ ACM/IEEE Intnl. Wsh. on System Level Interconnect Prediction, Monterey, CA, Apr. 2003.

Papanikolaou et al., "Methodology for propagating technology trade-offs over memory modules to the application level", Proc. of Program Acceleration through Application and Architecture driven Code Transformations (PA3C1) workshop, pp. 71-73, Edegem, Belgium, Sep. 2003.

Papanikolaou et al., "Overcoming the "memory wall" by improved system design exploration and a better link to process technology options", Proc. ACM computing Frontiers Conf., pp. 202-211, Ischia, Italy, Apr. 2004.

Papanikolaou et al., "Memory communication network exploration for low-power distributed memory organizations", Proc. Program Acceleration through Application ad Architecture driven Code Transformations (PA3CT) workshop, pp. 71-73, Edegem, Belgium, Sep. 2004.

Wang et al., "A global bus power optimization methodology for physical design of memory dominated systems by coupling bus segmentation and activity driven block placement", Proc. IEEE Asia and South Pacific Design Autom. Conf. (ASPDAC), Yokohama, Japan, pp. 759-761, Jan. 2004.

* cited by examiner

Rvector <R1...Rn>

Mvector = { <M1,...Mn> where Mi represents for each "element" (e.g. data array or instruction set or operation cluster or transfer block) a mapping with Start-time Si plus a resource assignment to Ri from Rvector}

Design-time phase

Introduce redundancy in the modules of the SoC /platform so that assignment choice exists for the "elements". Preferably heterogeneous choices are available for all of these For all possible elements and given assignment options:

- Define E/T operating points in the system by means of the design-time Pareto phase (with link to meta-flow). Use expected processing points (nominal values e.g.).

- These Pareto points should allow sufficient range variation for all critical system criteria (e.g. max power, energy, latency, throughput, QoS, ....)

- *It is sufficient if all modules in the design (data/instr memory hierarchy, network and proc. nodes) have a reasonable range of Pareto points with at least about 5 evenly distributed working points to choose from. (I.e. not all meta-flow steps have to be applied).*

Fig. 9

Calibration phase after processing (or after temperature variation or "electrical migration" affects the real operating conditions again)

The calibration Pareto-controller is activated to trace all stored Pareto curves and operating points (which are "powered on" by means of the control knobs) and based on the monitors for time, energy etc it calibrates them to the correct "spatio-temporal" values In that way, the stored Pareto curves should be "accurate" everywhere and NO process variation tolerances are needed.

Of course, we still assume that the circuit remains functional so a too large offset of some parameters due to process variation will still lead to a failing circuit (which can be detected by an on-line self-test controller that deactivates this circuit from further use at run-time)

Run-time phase

The steering Pareto-controller is activated whenever the OS or some other part of the application code executing on the platform requires a new element to be mapped or an old element "dies"

Based on the current Mvector and the (future) work-load, the Pareto control manager decides on a new mapping (assignment and schedule) of the elements (e.g. data and computations) such that the costs are reduced and all constraints are met. Note: sufficient mapping freedom is created for this search, because of the partially over-sized (redundant) resources on the platform.

In that way, still no process variation "slack" or "cloud" has to be incorporated in the actual execution!

Fig. 10

Rvector <R1...Rn>

Mvector = { <M1,..Mn> where Mi represents for each "element" (e.g.data array or instruction set or operation cluster or transfer block) a mapping with Start-time Si plus a resource assignment to Ri from Rvector}

Design-time phase

Introduce redundancy in the modules of the SoC /platform so that assignment choice exists for the "elements". Preferably heterogeneous choices are available for all of these For all possible elements and given assignment options:

- Define E/T operating points in the system by means of a simplified design-time Pareto phase starting from low-level source code and an initial valid mapping (no other steps of meta-flow). Use expected processing points (nominal values e.g.).

- These Pareto points should allow sufficient range variation for all critical system criteria (e.g. max power, energy, latency, throughput, QoS, ...)

- *It is sufficient if all modules in the design (data/instr memory hierarchy, network and proc. nodes) have a reasonable range of Pareto points with at least about 5 evenly distributed working points to choose from. (I.e. not all meta-flow steps have to be applied).*

Fig. 11

Calibration phase after processing (or after temperature variation or "electrical migration" affects the real operating conditions again)

The calibration Pareto-controller is activated to trace all stored Pareto curves and operating points (which are "powered on" by means of the control knobs) and based on the monitors for time, energy etc it calibrates them to the correct "spatio-temporal" values In that way, the stored Pareto curves should be "accurate" everywhere and NO process variation tolerances are needed.

Of course, we still assume that the circuit remains functional so a too large offset of some parameters due to process variation will still lead to a failing circuit (which can be detected by an on-line self-test controller that deactivates this circuit from further use at run-time)

Run-time phase

The steering Pareto-controller is activated whenever the OS or some other part of the application code executing on the platform requires a new element to be mapped or an old element "dies"

Based on the current Mvector, the Pareto control manager decides on a new mapping (assignment and schedule) of the elements (e.g. data and computations) such that the costs are reduced and all constraints are met. Note: sufficient mapping freedom is created for this search, because of the partially over-sized (redundant) resources on the platform. More effort will be needed than the "normal" version because less design-time mapping info is stored In that way, still no process variation "slack" or "cloud" has to be incorporated in the actual execution!

Fig. 12

METHOD AND APPARATUS FOR DESIGNING AND MANUFACTURING ELECTRONIC CIRCUITS SUBJECT TO PROCESS VARIATIONS

RELATED APPLICATIONS

This patent application claims the benefit of U.S. Provisional Application No. 60/612,427, filed Sep. 23, 2004, which is hereby incorporated by reference in its entirety.

BACKGROUND OF THE INVENTION

1. Field of the Invention

The invention relates to design methodologies for electrical systems, more in particular electrical circuits (especially digital circuits), to circuitry designed with said methodologies and to circuit parts, specially designed and incorporated within said digital circuits to enable operation of said circuits in accordance with the proposed concepts.

2. Description of the Related Art

Technology scaling has historically improved the performance of embedded systems, both in energy consumption and in speed. Scaling minimum feature sizes below 100 nm however, brings a host of problems, which cannot be completely solved at technology level. Back-end performance degradation, increased leakage currents and increased process variability are only a few examples. Process variability is probably the most important one because it has a direct negative impact on yield and it has a large impact on all the characteristics of the system, as described by H. Chang et al. in "The certainty of uncertainty: randomness in nanometer design", Proc. of PATMOS, pp. 36-47, 2004.

Due to the stochastic nature of process variability, the only way to maximize the parametric system yield, i.e. the number of samples that meet the timing constraints, is either by incorporating corner-point analysis in the designs, or by run-time techniques which can measure the actual variability and adapt the operation of the system, because it is impossible to predict the impact of process variability on a system before the chip is processed.

Especially deep submicron (DSM) technologies, e.g. process technology nodes for 65 nm and beyond, suffer from large variability in integrated circuit (IC) parameters. These variations may be due to several reasons:

"process" differences between dies (inter-die variations).

"spatial" differences in processing for different parts of the die (intra-die variations). There is an increasing difficulty in controlling the uniformity of critical process parameters (e.g. doping levels) in the smaller devices, which makes the electrical properties of such scaled devices much less predictable than in the past.

"temporal" differences due to "degradation" processes. These include electromigration (which influences resistance R and partly capacitance C of lines), self-annealing of Cu (which influences resistance R of lines), stability of low-k dielectrics (which influences R/C of lines) and of high-k dielectrics (which influences threshold voltage Vt), hot electron trapping (which also influences threshold voltage Vt) and cross-talk (which causes "pseudo C" changes and noise). These temporal differences should be relatively slow and easy to "follow up" or monitor.

"temperature-related" differences due to strong variations in temperature T over time. Because of this, threshold voltage Vt and resistance R of lines are influenced. These temperature-related differences can vary quite fast (up to msec range) and hence are more difficult to monitor and calibrate.

Memories are among the most variability sensitive components of a system. The reason is that most of the transistors in a memory are minimum-sized and are thus more prone to variability. Additionally some parts of the memories are analog blocks, whose operation and timing can be severely degraded by variability, as illustrated in FIG. 1, showing the impact of process variability on the energy/delay characteristics of a 1 kByte memory at the 65 nm technology node. The solid blocks on the bottom left indicate the simulated nominal performance assuming no process variability (squares for writing and triangles for reading). The other points are simulation results incorporating the impact of variability (+-signs for writing and x-signs for reading). The energy consumption and delay of a memory designed using corner-point analysis is also shown (black circle).

In a target domain of multimedia applications, memories occupy the majority of the chip area even in current designs and contribute to the majority of the digital chip energy consumption. Therefore they are considered to be very important blocks for a system.

Solutions Offered in the Technical Background

Process variation has thus become a serious problem for continued technology scaling. It becomes harder and harder to deal with this at the technology and circuit levels only. Several proposed schemes are not even scalable to deep-submicron technologies because the body-bias effect will become very small.

If all of these effects have to be characterized at "design time", and furthermore it has to be guaranteed that the design will still work under all possible conditions, the slack that will have to be introduced will become prohibitive in the deep-submicron era.

Maximizing parametric yield in memories via corner-point analysis and design will, by the size of the "clouds" due to process variability, lead to severe overheads in energy consumption and delay, as indicated in FIG. 1 (black circle). The reason is that the memory design will use over-sized circuits and conservative timing margins to improve the predictability of the memory behaviour by trading off performance.

Even when such so-called corner-point approach that leads to very worst-case nominal designs is substituted by a more stochastic analysis at design-time, as e.g. described by C. Visweswariah in "Death, taxes and failing chips", Proc. 39th ACM/IEEE Design Automation Conf., New Orleans La., pp. 343-342, June 2002, the gain is relatively small compared to increased problem when scaling further.

SUMMARY OF THE INVENTION

One embodiment provides improved design environments and methodologies for electrical systems, more in to provide particular improved electrical circuits (especially digital circuits, analog circuits or mixtures or hybrids thereof), to provide improved circuitry designed with said methodologies or using said environments and to provide improved circuit parts, e.g. specially designed and incorporated within said electrical circuits to enable operation of said circuits in accordance with the proposed concepts. An advantage of the present invention is that it can avoid a worst-case design-time characterisation of circuits when designing electrical circuits taking into account the variability in IC parameters in deep submicron technologies.

The above objective is accomplished by a method and device according to the present invention.

One embodiment is based on the so-called design-time run-time separation approach, wherein the design problem is dealt with at design-time but some decision-taking is done at run-time, the design time part being adapted so as to generate a substantial freedom for a run-time controller. In other words, the worst-case design margins are alleviated by designing the circuit in a way that allows the unpredictability of its behaviour, even though the parametric specifications are not met at module level. For example, process variations in the manufacture of the actual circuit can be the cause of an unpredictable behaviour at run time The information provided by the design-time part is communicated to the run-time controller via a format, such as e.g. a table, wherein circuit performance parameters (like energy consumption, timing performance, quality of the operation) are linked to cost parameters, the performance-cost pairs together forming working points, said working points being pre-selected from a larger possibility set, said pre-selection being done at design-time. As an example so-called Pareto curves may be used for defining the pre-selected working points. In an alternative approach working points within an offset of such a Pareto curve are used (so-called fat Pareto curve approach). These approaches are fully explained in US 2002/0099756 (task concurrency management), US 2003/0085888 (quality-energy-timing Pareto approach), EP 03447082 (system-level interconnect). These representations of working points is denoted Pareto-like. An advantageous feature of these curves is that they provide a substantial range on the parameters. It is only in a preferred embodiment that they are selected to be optimal, in the Pareto-sense.

In a first aspect of the present invention, it is desired to avoid the problem of "stochastic analysis" and "clouds around nominal working points". First several possible working points are stored with different mappings to available modules. Each of these working points involves different trade-offs for important criteria related to performance (time budget, data rate, latency etc.) and costs (energy, memory foot-print etc.). Trade-offs are tuples comprising a value for a resource and the value for a constraint. The combination of values of the resource and the constraint are not necessarily an optimisation but rather a selection of parameters which balance certain advantages and disadvantages in a useful manner. Initially, i.e. at the design stage, these trade-off points for the criteria are not calibrated to the actually processed chip or the actual run-time conditions (such as temperature or process degradation). This calibration will occur with the actual circuit. However at the design stage the trade-offs can be and are preferably selected to be particularly useful with actual circuits, i.e. the trade-offs take into account typical process variations.

Subsequently, based on actual values of the criteria at given run-time conditions for (a subset of) the working points, it is possible to calibrate the trade-off curves and use a run-time controller to select the most suited working points afterward for an actual circuit. These active working points are selected to just meet the necessary system requirements on performance, while minimizing any of the important cost parameters.

Details on how selection of working points is done from the information of said trade-off optimisation information, e.g. Pareto-like optimization information, is given in US 2003/0085888.

The invention also includes a program storage device, readable by a machine, tangibly embodying a program of instructions, comprising: selecting working points for at least two tasks from actual measured Pareto-like information.

A second aspect underlying the entire approach is the strict separation of functional and performance/cost issues, e.g. timing/cost issues. The functional correctness is checked by a layered approach of built-in self-test controllers, as described in conventional BIST literature, which check the correct operation (based on test vectors) of the modules. BIST is the technological approach of building tester models onto the integrated circuit so that it can test itself. Checking of the correct operation has to be based on a good knowledge of the cell circuits and DSM technology effects that influence the choice of the test vectors. Furthermore system-level functionality checks may be needed to check that the entire application is working correctly on a given platform. Main system validation should happen at design-time, but if some of the DSM effects influence the way the critical controllers work, then these are better checked once at start-up time to see whether they function correctly.

Effectively dealing with the performance/cost, e.g. timing/cost, variations then, according to the present invention, goes as follows:

At design-time a thorough analysis and exploration is performed to represent a multi-objective "optimal" trade-off point or points, e.g. on Pareto curves, for the relevant cost (C) and constraint criteria. More formally, the trade-off points may e.g. be positions on a hyper-surface in an N-dimensional Pareto search space. The axes represent the relevant cost (C), quality cost (Q) and restriction (R) criteria. Each of these working points is determined by positions for the system operation (determined during the design-time mapping) for a selected set of decision knobs (e.g. the way data are organized in a memory hierarchy). The C-Q-R values are determined based on design-time models that then have to be "average-case" values in order to avoid a too worst-case characterisation.

At processing time, first a run-time BIST manager performs a functional correctness test, i.e. checks all the modules based on stored self-test sequences and "equivalence checker" hardware. All units that fail are deactivated (so that they cannot consume any power any more) and with a flag the run-time trade-off controllers, e.g. Pareto controllers, are informed that these units are not available any more for the calibration or the mapping.

At processing time, also a set of representative working points are "triggered" by an on-chip trade-off calibration manager, e.g. a Pareto calibration manager, that controls a set of monitors which measure the actual C-Q-R values and that calibrates the working points to their actual values. Especially timing monitors require a careful design because correctly calibrated absolute time scales have to be monitored. This can be achieved with techniques similar to the ones described by M. Abas, G. Russell, D. Kinniment in "Design of sub-10-picoseconds on-chip time measurement circuit", Proc. 7th ACM/IEEE Design and Test in Europe Conf. (DATE), Paris, France, February 2004, which techniques make use of an external tester and delay lines.

The above way of working removes the possible negative impact of most of spatial and processing variations in a circuit. As a result the design-time curves come quite close to 'modeling reality', instead of a worst-case approximation, as would be the case in the currently performed approaches. An assumption here is that the relative position and shape of curves formed by the trade-off points, e.g. Pareto curves formed by Pareto points, (the hyper-surface) do not change too much between the "design-time simulation" and the "physically processed chip" version. The absolute values may change drastically but it can be expected that the shape of the curves is quite similar.

In this way, the "stochastic clouds" and the "corner point procedure" that are presently used to have the "worst-case condition" characterisation of modules embedded on a system-on-chip (SoC) can be avoided nearly completely. As long as enough redundant units are present (e.g. 20%), the run-time trade-off control manager, e.g. Pareto control manager, can still find a mapping that will meet the constraints for the locations on the SoC that are processed with very bad parameter conditions. But for any location (and "time point") where the process parameters are better, the same constraints will be met with a reduced cost due to the trade-off point curve, e.g. Pareto curve, storage. Due to the use of the step with the self-test controller in a method according to the present invention, also outliers can be handled where the process parameters are so badly conditioned that the unit is not properly operating any more. Obviously, if the number of faulty units identified with this self-test becomes too high, the yield is too low and hence too few units will be left on the SoC for the run-time trade-off managers, e.g. Pareto managers, to find a valid point/mapping for each constraint set. So the yield should still be somewhat optimized for the given process technology.

Alternatively formulated the present aspect of the present invention can be formulated as follows:

A method for operating a terminal having a plurality of resources (modules) and executing at least one application in real-time, wherein the execution of said application requires execution of at least two tasks, the method comprising selecting a task operating point from a predetermined set of optimal operating points, said terminal being designed to have a plurality of such optimal operating points, said predetermined set of operating points being determined by performing measurements on said terminal.

The invention will be illustrated for a digital audio broadcast (DAB) application but is not limited thereto.

It is an aspect of the invention to provide run-time compensation of stochastic process variability effects for digital devices.

It is an aspect of the invention to provide a characterization evaluation method for deep submicron devices under process variability. The invention will be illustrated for memory modules, in particular SRAMs (static random access memories).

Understanding how variability propagates at the IP block level is important for efficient system level design. The use of the method according to the present invention within system level design methods will be presented also.

In essence a system level design method is provided which can counteract effects due to process variations.

The present invention provides a method for generating a real-time controller for an electronic system, said electronic system comprising a real-time controller and an electronic circuit, the method comprising:
  generating a first system-level description of the functionality and timing of a simulated electronic circuit;
  generating from said first system-level description a second system-level description, including first trade-off information;
  generating a run-time controller for use with a design for an actual electronic circuit to be manufactured from said second system-level description, said actual electronic circuit, when manufactured, being capable of exploiting said first trade-off information, said actual electronic circuit when manufactured differing from said simulated electronic circuit due to process variations of its manufacture, whereby the run-time controller is adapted to use second actual trade-off information determined from a manufactured actual electronic circuit.

The second system level description can be operable in various working modes, each of said working modes having a unique performance/cost characteristic, said performance/cost characteristics of said working points defining a performance/cost trade-off relationship, said actual electronic circuit being capable of operating under said working modes.

The electronic circuit can be digital or analog or a mixture of the two.

The present invention also provides a run-time controller for controlling an electronic circuit, the controller comprising:
  means for inputting an actual performance constraint;
  means for selecting working points on a trade-off performance/cost relationships, based on said actual performance constraint,
  means for enforcing said selected working point for said electronic circuit.

The present invention also provides an electronic system comprising:
  an electronic circuit, including at least one performance and cost monitor, for monitoring performance and cost of operation of the electronic system, and
  a run-time controller, for selecting working points on a trade-off performance/cost relationship, based on an actual performance constraint, said run-time controller inputting performance and cost information from said performance and cost monitor.

The present invention also provides a method for generating a run-time controller of an electronic system, comprising an electronic circuit comprising a plurality of modules, and said run-time controller, the method comprising:
  generating a first system-level description of the functionality and timing of a simulated electronic circuit comprising modules;
  generating from first said system-level description for at least two of said modules a second system-level description, including first trade-off information;
  generating a run-time controller for the properly functioning modules of an actual electronic circuit to be manufactured from said second system-level description, said actual electronic circuit, when manufactured, being capable of exploiting said first trade-off information, said actual electronic circuit when manufactured differing from said simulated electronic circuit due to process variations of its manufacture, whereby the run-time controller is adapted to use second actual trade-off information determined from a manufactured actual electronic circuit.

The present invention provides a method for designing an electronic system, comprising a real-time controller and an electronic circuit, comprising of modules, the method comprising:
  generating a first system-level description of the functionality and timing of a simulated electronic circuit comprising modules;
  generating from first said system-level description for at least two of said modules a second system-level description, including first trade-off information;
  generating a run-time controller for the properly functioning modules of an actual electronic circuit to be manufactured from said second system-level description, said actual electronic circuit, when manufactured, being capable of exploiting said first trade-off information, said actual electronic circuit when manufactured differing from said simulated electronic circuit due to process variations of its manufacture, whereby the run-time controller is adapted to use second actual trade-off information determined from a manufactured actual electronic circuit designing an actual digital device from said second system-level description, said actual digital device being capable of exploiting said trade-off information, said actual digital device, differing from said ideal digital device due to process variations, determining actual trade-off information from said actual digital device;

determining which modules of the actual digital device are properly functioning;

generating a real-time controller for the properly functioning modules of the actual digital device, said real-time controller uses said actual trade-off information.

The present invention provides a method for operating an electronic circuit, the method comprising:

loading working points involving trade-offs for criteria related to performance and cost, for an ideal template of said electronic circuit, calibrating trade-off curves based on actual values of the criteria at given run-time conditions, loading a performance constraint and selecting a best suited working point in view of said performance constraint.

The present invention also provides a machine-readable program storage device embodying a program of instructions for execution on a processing engine, the program of instructions defining a real-time controller for an electronic system, said electronic system comprising a real-time controller and an electronic circuit, the program instructions implementing:

generating a first system-level description of the functionality and timing of a simulated electronic circuit;

generating from said first system-level description a second system-level description, including first trade-off information;

generating a run-time controller for use with a design for an actual electronic circuit to be manufactured from said second system-level description, said actual electronic circuit, when manufactured, being capable of exploiting said first trade-off information, said actual electronic circuit when manufactured differing from said simulated electronic circuit due to process variations of its manufacture, whereby the run-time controller is adapted to use second actual trade-off information determined from a manufactured actual electronic circuit.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 9 illustrates a design-time algorithm for process variation handling.

FIG. 10 illustrates a run-time algorithm for process variation handling.

FIG. 11 illustrates a design-time algorithm for process variation handling in case of reduced flexibility in the mapping.

FIG. 12 illustrates a run-time algorithm for process variation handling in case of reduced flexibility in the mapping.

DETAILED DESCRIPTION OF ILLUSTRATIVE EMBODIMENTS

Figure 1:
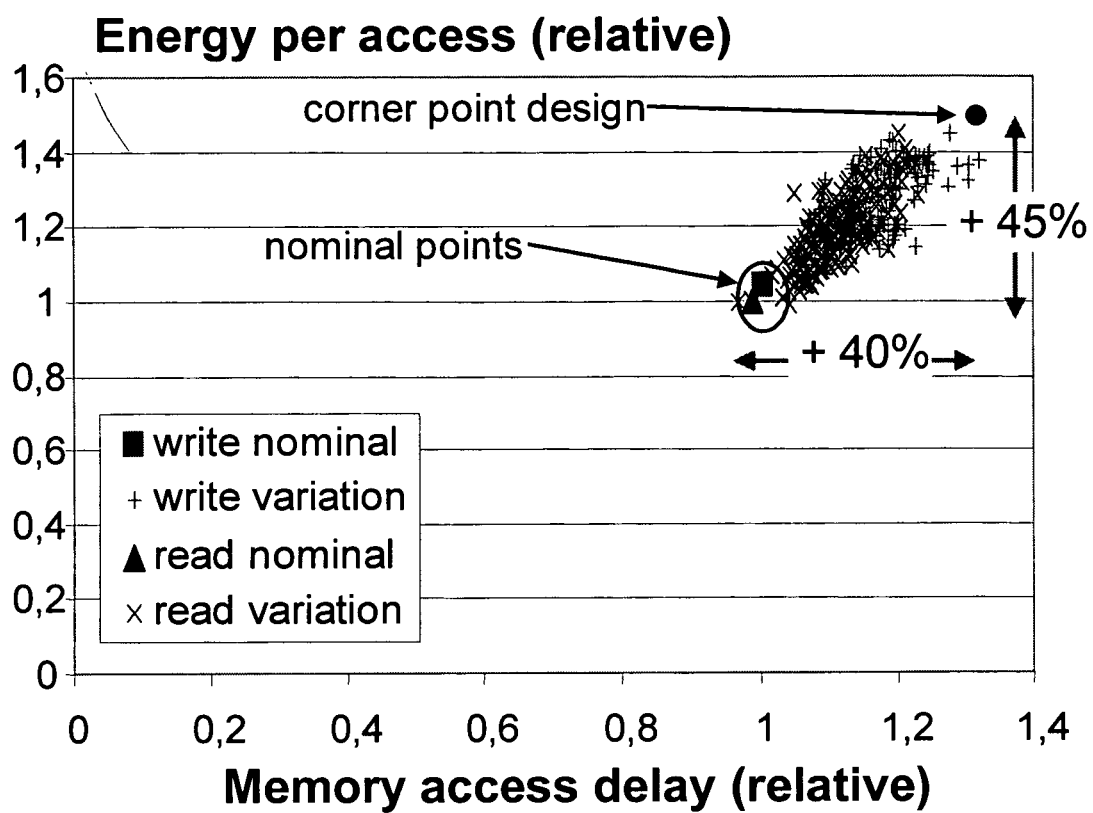
FIG. 1 illustrates the impact of process variability on the energy/delay characteristics of a 1 kByte memory at the 65 nm technology node.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

The invention may exploit, in one aspect, the system-wide design-time/run-time (meta) Pareto approach as described in US 2002/0099756 (task concurrency management), US 2003/0085888 (quality-energy-timing Pareto approach), EP 03447082 (system-level interconnect). Alternatively, the invention may exploit another trade-off approach.

The approach of the present invention is to explicitly exploit a variation in system-level mapping to increase the overall cost/performance efficiency of a system.

A difference between the method of the present invention compared to existing approaches is that the existing prior art methods try to monitor the situation and then "calibrate" a specific parameter. But in the end only one "working point" or "operating point" is present in the implementation for a given functionality. So no "control knobs" (control switches or functions) are present to select different mappings at run-time for a given application over a large set of heterogeneous components. The mapping is fixed fully at design-time. Moreover, the functional and performance requirements are both used to select the "working" designs/chips from the faulty ones. So these two key requirements are not clearly separated in terms of the test process.

Figure 2:
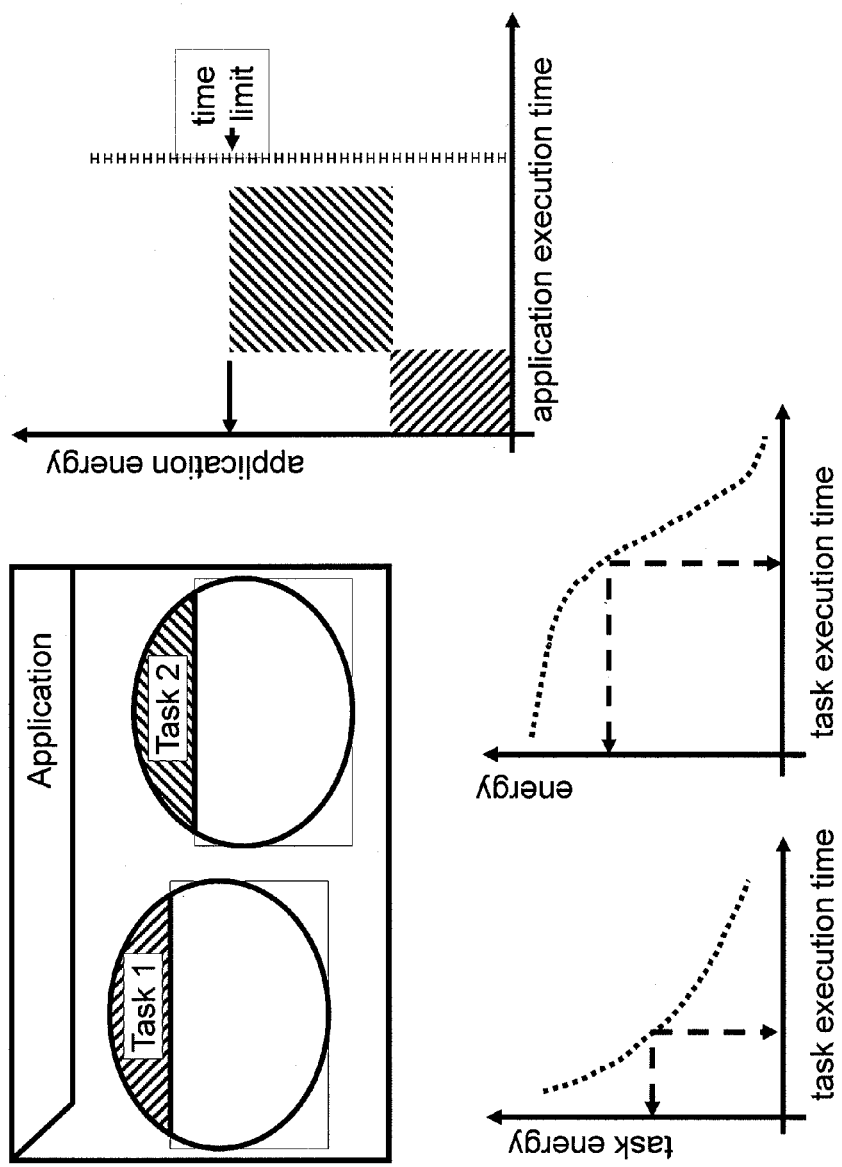
FIG. 2 illustrates the design-time/run-time principle according to an embodiment of the present example, whereby an original run-time example is shown.

An example is shown in FIG. 2 where there are originally two active entities (or tasks in this case), task 1 and task 2. Each of them has a trade-off curve, e.g. Pareto curve, showing the relationship between performance, in the example given task execution time, and cost, in the example given task energy. On each of these trade-off curves a working point has been selected for the corresponding task, so that both tasks together meet a global performance constraint, in the example given a maximum "time limit" on the application execution time for the target platform (top right). The working point, e.g. Pareto point, for each task has been selected such that the overall cost, in the example given application energy, is minimized.

Figure 3:
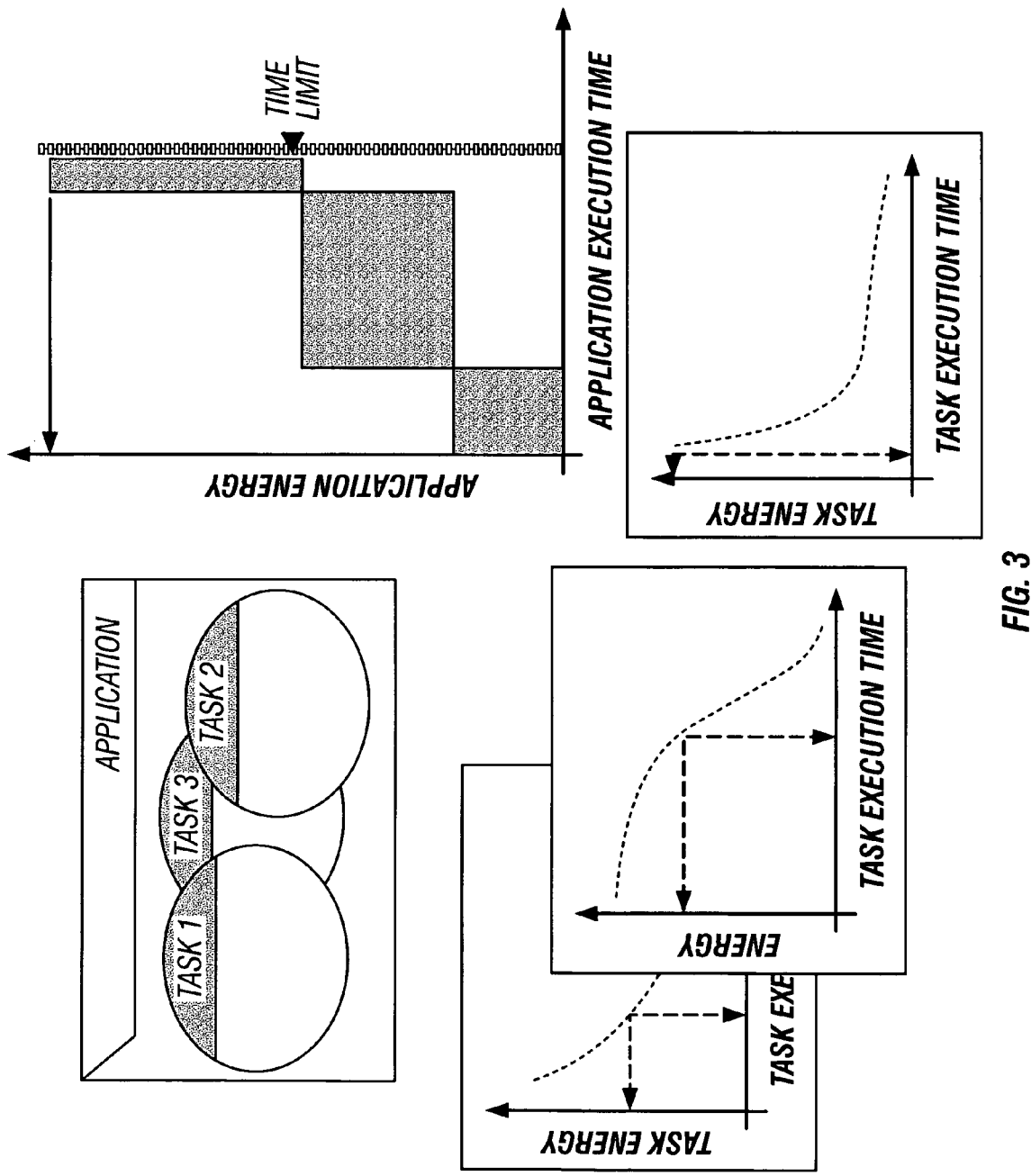
FIG. 3 illustrates the design-time/run-time principle according to an embodiment of the present example, whereby an unoptimized run-time example is shown.

When a third task, task 3, now enters the system and it has to be mapped on the same platform resources, sufficient time has to be created for it. If the working points, e.g. Pareto points, (mappings) of the already running tasks task 1 and task 2 cannot be changed, a very energy-costly overall solution is obtained, as indicated in FIG. 3. Indeed, only a very small slack is still available within the time limit (top right).

Figure 4:
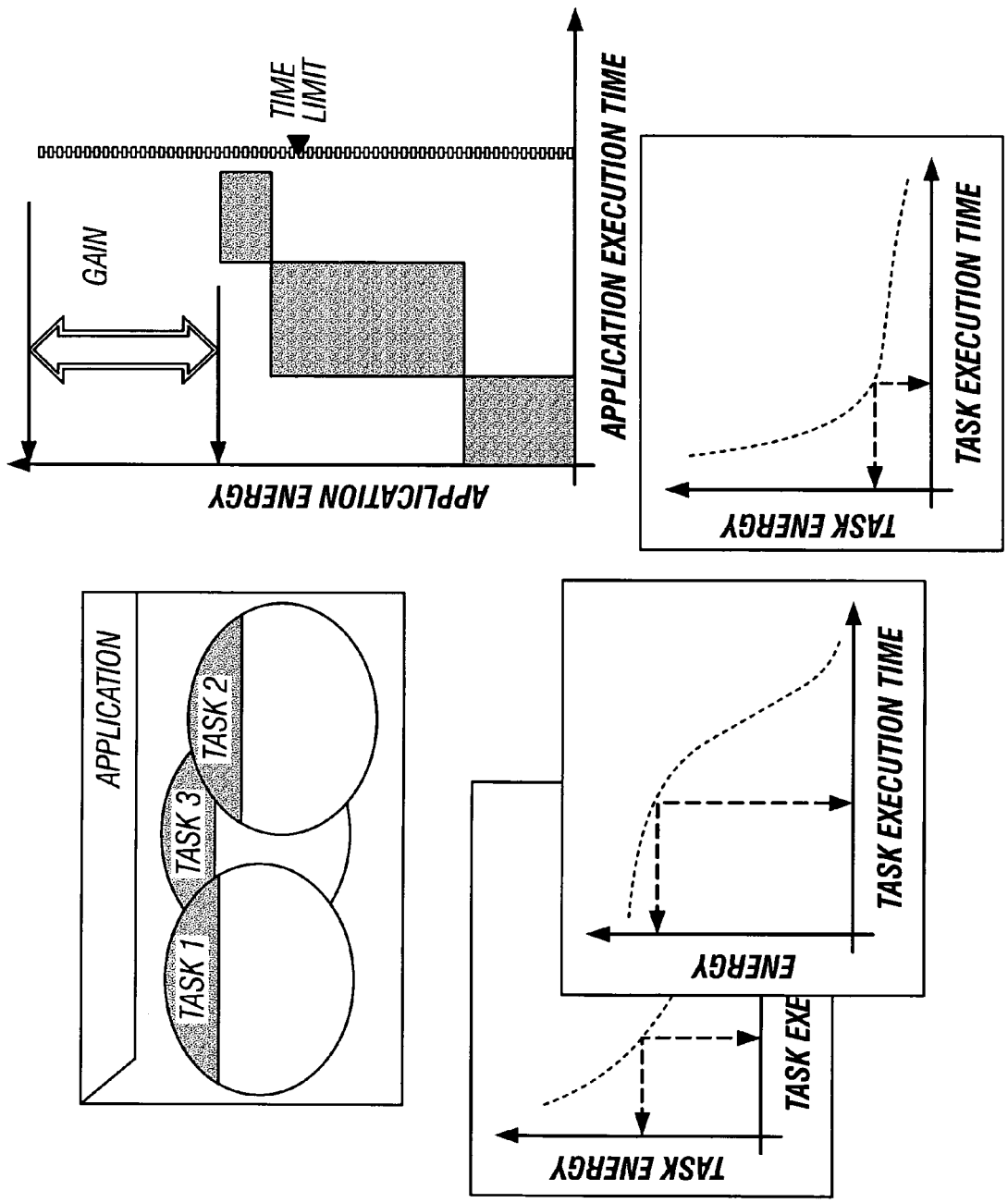
FIG. 4 illustrates the design-time/run-time principle according to an embodiment of the present example, whereby an optimized run-time example is shown.

However, if the working point, e.g. Pareto point, for any of task 1 or task 2 can be changed, e.g. the working point for task 2 can be changed, then sufficient slack is created for task 3 to select a much less energy costly point (see FIG. 4). The overall application energy now exhibits a considerable gain—the gain indicated in FIG. 4 is the difference between the cost in the situation of FIG. 3 compared to the cost in the situation of FIG. 4, while the application still meets the overall execution time limit on the given platform.

Figure 5:
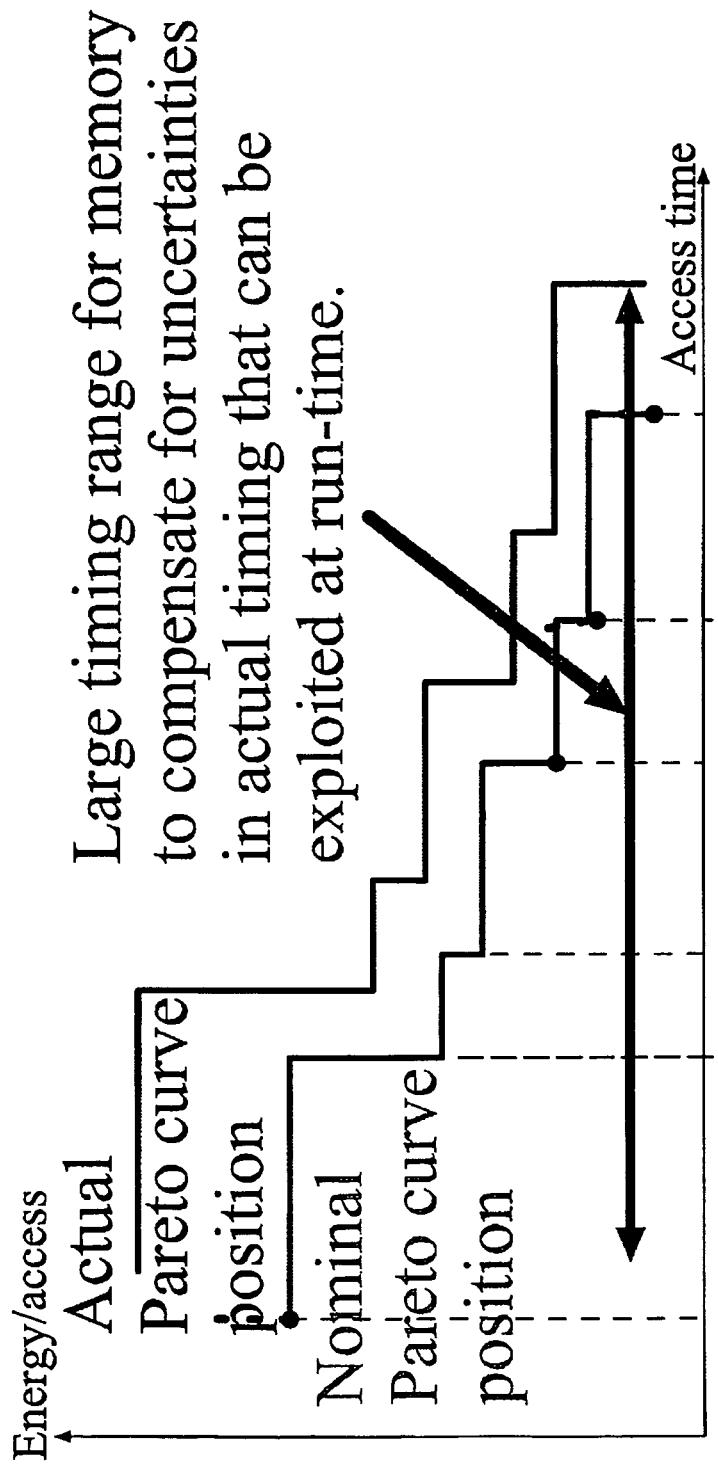
FIG. 5 illustrates designed and actual Pareto curves with cost (energy) versus performance (time) for a given module/component, the component being a memory in the example given. All non-optimal points can be discarded at design-time. The timing range can be exploited to compensate for uncertainties after processing.

When dealing with performance/cost issues, e.g. timing/cost issues, it is assumed that a large performance range, e.g. a large timing range, is available in the trade-off curve, e.g. Pareto curve (as illustrated in FIG. 5, where performance/cost ratio is exemplified by access time/energy consumption ratio). Such large performance range can be achieved by a proper exploration/design/analysis phase at design time. This range will allow, according to the present invention, to compensate at run-time any performance uncertainties or variations, in the example given timing uncertainties or variations (whether they are spatial or temporal does not matter) as long as they are smaller than half the available range. It is to be noted that this approach does not only deal with performance uncertainties due to process technology variations but also due to higher-level variations, e.g. due to a circuit malfunction (which changes performance, e.g. timing, but not the correct operation) or even architecture/module level errors (e.g. an interrupt handler that does not react fast enough within the system requirements). As long as the working range on the performance axis has enough points available to compensate for the lack of performance, e.g. "lack of speed", compared to the nominal point, these variations can be compensated for at run-time.

As can be seen from FIG. 5, at design time a nominal trade-off curve, e.g. a nominal Pareto curve, can be established, giving a relationship between performance and cost, in the example given in FIG. 5 a relationship between memory access time and energy consumption. The nominal trade-off curve, e.g. Pareto curve, can be stored, e.g. in a Pareto point list stored in a table. During actual use of the circuit, an actual trade-off curve, e.g. Pareto curve, can be established, which may differ from the nominal trade-off curve due to process variations.

Any uncertainty in the actual timing of the circuit after processing can be compensated by shifting to another point on the "actual" trade-off curve, e.g. Pareto curve. The range for compensation equals the performance range, e.g. the entire time range, of the actual trade-off curve that can be designed such that it is larger than any of the potential uncertainties after processing. It is to be noted though that the position of the new working points, i.e. the points on the actual trade-off curve, can differ quite a bit after processing. Moreover, some of the original points on the nominal trade-off curve could move to a non-optimal, e.g. non-Pareto optimal, position after processing. In that case, they are removed from the nominal trade-off curve as stored, e.g. the Pareto point list stored in tables.

In order to reduce the risk of not having enough valid trade-off points, e.g. Pareto points, after the processing, the original trade-off curve is preferably provided with an offset e.g. a so-called "fat" Pareto curve is established, which means that additional working points are added to the module that are initially above the trade-off curve, e.g. Pareto curve, but that have a high sensitivity (in the "beneficial direction") to parameters that are affected by processing. So these working points are likely to move to a more optimal position after processing. The best suited number and position of additional points in the trade-off curve with an offset, e.g. fat Pareto curve, can be decided at design-time by analysis of a well-matched process variation model. A trade-off is involved between extra overhead due to storage of the additional points and the possibility to more optimally compensate for the variations. It is to be noted that even if the available range becomes relatively small compared to the initially available range, the different global mapping of the application over all working modules will still allow to compensate for that limited range. This remains true as long as sufficient working modules with a sufficient timing range are available in the overall design. So some redundancy should be provided in the number of components that is initially instantiated on the system/SoC.

In this way, substantially no slack or even no slack at all has to be provided any more in the tolerances for the nominal design on the restricting criteria (e.g. data rate or latency), and hence the likelihood of a significant performance and/or cost gain is high with the approach according to the present invention. In the (unlikely) very worst-case, the performance is still as good as the conventional approach can provide. This is based on the "robustness" of a run-time trade-off controller, e.g. Pareto controller (see below), to modifying the position of the trade-off curves, e.g. Pareto curves, even at run-time.

So the approach according to embodiments of the present invention involves a significant generalisation of the current "run-time monitoring" approaches, transposed in a digital system design context, where the monitored information is used to influence the actual settings of the system mapping. Furthermore, also a practically realisable implementation is proposed of the necessary "timing compensation" that is needed in such a system-level feedback loop.

Operation Phases

According to embodiments of the present invention, the operation of a system is divided into three phases, namely a measurement phase, a calibration phase and a normal operation phase. During the measurement phase the characteristics of the circuit, e.g. all memories, are measured. In the calibration phase a process variation controller (PVC) selects the appropriate configuration-knobs for the circuit, and applies them directly to the circuit. The phase of normal operation is for executing the target application on the platform.

In the explanation given hereinafter, reference is made to memories; however it is to be understood that this is as an example only, and is not intended to be limiting. Where "memories" has been written, the broader notion of circuit has to be understood. Memories are only one type of circuits which are particularly susceptible to process variations.

Measurement Phase

During the measurement phase the cost is measured in function of performance of the circuit.

For example in case of a memory organization, energy consumption per access (cost) and the delay (performance) of each memory in the organisation are to be measured. Therefore, each memory in the memory organization may be accessed a pre-determined number of times, e.g. four times, to measure read and write performance of a slow and a fast configuration. All these performance values for delay and energy consumption of a memory need to be updated in the PVC for each memory in the system. Furthermore for all of these pre-determined number of measurements (e.g. slow read; slow write; fast read; fast write) the worst-case access delay and energy of each memory needs to be extracted. A methodology for doing this has been proposed in H. Wang, M. Miranda, W. Dehaene, F. Catthoor, K. Maex, "Systematic analysis of energy and delay impact of very deep submicron process variability effects in embedded SRAM modules", accepted for 2005. According to this methodology, test vectors are generated based on two vector transitions that can excite the memory addresses which exhibit the worst-case access delay and energy consumptions. These test vectors are generated in a BIST-like manner. Furthermore a memory has also different delays and energy consumptions for each of its bit- and wordlines. Therefore the worst-case access delay and energy consumption have to be calculated. This calculation is done already within monitors or monitoring means (see below) and so only the worst-case values have to be communicated over the network.

Figure 6:
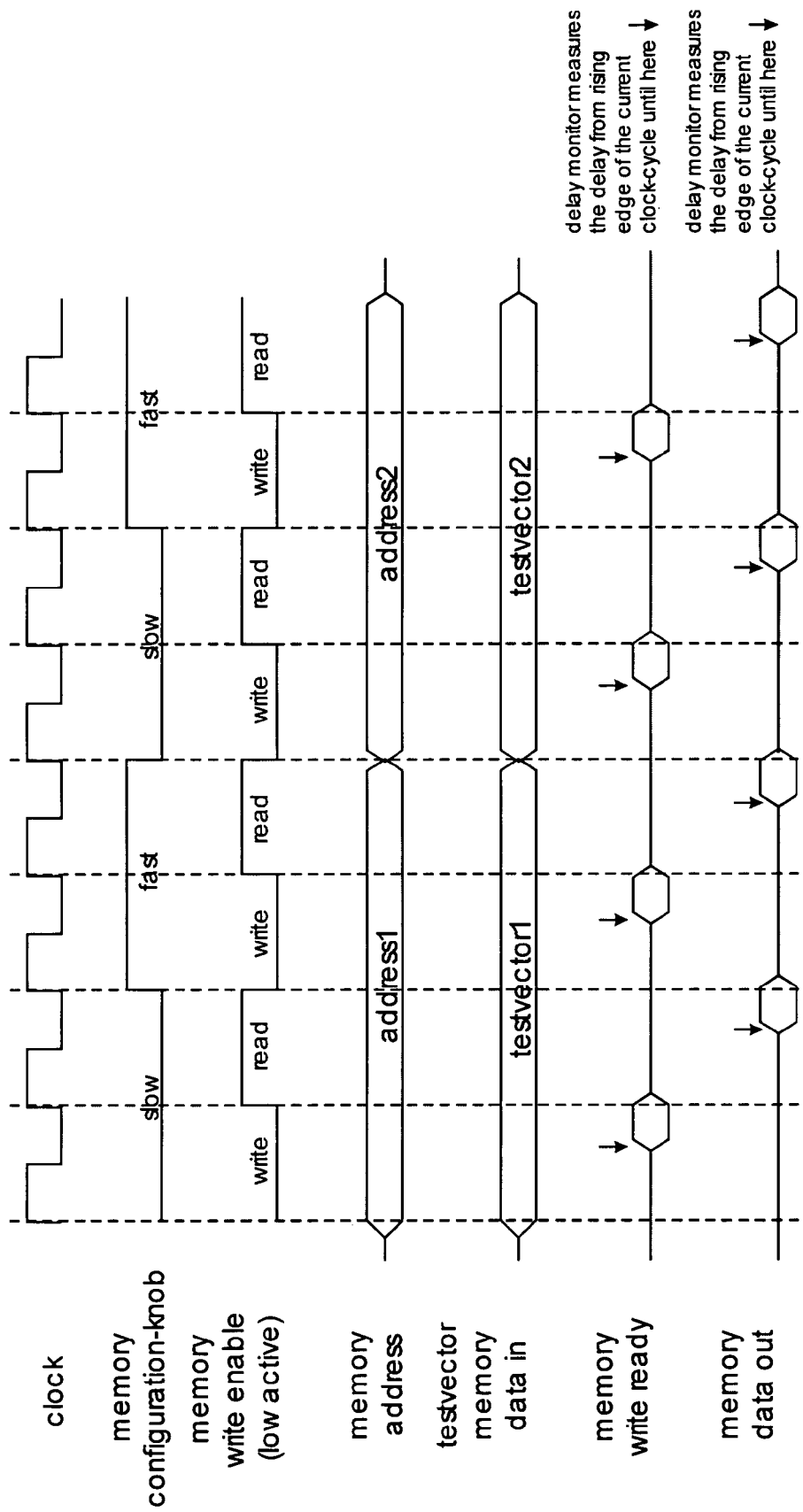
FIG. 6 shows measurement of access delay for two testvectors and two addresses on one memory.

In the beginning of this measurement phase the process variation controller (PVC) reads a first test vector from a test vector memory and configures the network in order to be able to communicate with the memory under test. Also delay and energy monitors are connected to the memory which is currently under test. The functional units of the application itself are decoupled from this procedure. Then the PVC applies a test vector including address and data to the memory. In a first step the memory is written and so the ready bus of the memory is connected to the delay monitor. The time to apply one test vector to the memory is equal to one clock-cycle. For measurement the clock is configured via a phase-locked-loop in a way that the monitors have a stable result before the beginning of the next clock-cycle. In the next clock-cycle the memory is read from the same address as before, so the same test vector is still in use. In this cycle the data-out bus of the memory is connected to the delay monitor in order to measure the time after which the output of the memory is stable. In a third step the memory configuration-knob is changed from slow to fast which means that the memory is now configured to its faster and more energy consuming option. Still the same test vector is applied and step one and two are repeated for the fast configuration-knob of the memory under test. These four steps which are described in FIG. 6 are repeated for all test vectors of the memory under test.

After all the test vectors for the currently measured memory are applied, the delay and energy monitors send back the maximum delays and energy consumptions of all pre-determined, e.g. four, possible options of this particular memory under test. The pre-determined number, e.g. four, maximum delay and maximum energy consumption values (e.g. each for slow read, slow write, fast read and fast write) are stored into a register file within the PVC in order to be able to decide during the calibration phase which configuration of the memory has to be chosen.

Figure 7:
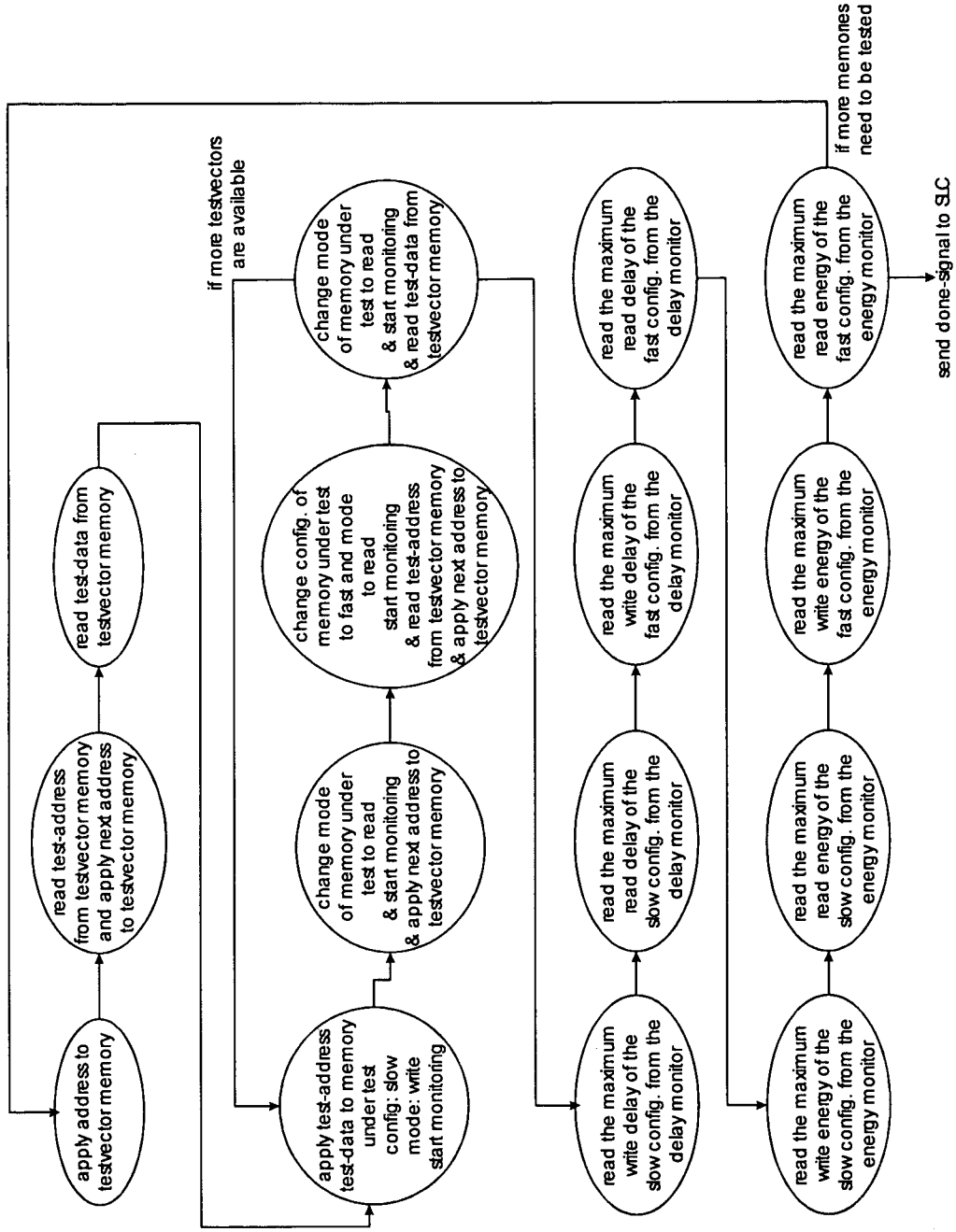
FIG. 7 shows a finite state machine of the measurement phase.

All these steps are repeated for each memory in the system and so finally all the maximum delays and energy consumptions of each memory are known by the PVC. The different steps are also identified in FIG. 7.

It is clear that the measurement phase is a rather tedious and time consuming procedure. The total number of words which have to be accessed in a system using the DAB receiver as illustrated below is 23552. Assuming that energy measurement takes the same amount of cycles as the delay measurement which was described above the measurement phase for this system requires 188512 cycles. It is sufficient to perform it every time the system starts up, as the temporal effects due to process variability, related to reliability for instance, can be assumed to be very slow.

After all memories have been measured, the PVC tells the system-level-controller that the measurement phase is finished. The system-level-controller is now the one which has to decide how to proceed. Usually it decides now to proceed with the calibration phase, in which the most efficient memory configuration for the system has to be found.

Calibration Phase

During the calibration phase, the PVC configures the memories of the system in order to meet the actual timing requirements of the application. Therefore the PVC uses dedicated control lines which are connected to each memory of the architecture.

Apart from the information about delay and energy of each memory, which information was stored during the measurement phase, the PVC holds information about the current timing constraint for the specific application. This timing constraint is also stored in a register and can be changed at runtime, if the register is memory-mapped. The timing constraint is generated during the design-time analysis of the application according to the bandwidth requirements of the application.

The PVC is calculating all necessary information to configure the configuration-knobs of the memories in order to meet the timing constraint. These calculations are depending on the adaptation the controller operates on. In clock-cycle-level adaptation the controller will only decide based on the configuration-knobs the memories are providing. In time-frame-level adaptation the controller is providing more accurate configurations gained from the fact that the application is time-frame based and the functional units are executed sequentially. Based on the information gained with one of the two approaches the most efficient configuration for the memory configuration-knobs in terms of delay and energy is applied.

Normal Operation

Normal operation is the phase where the target application is executed on the functional units of the platform. All other components like the PVC and the energy and delay monitors are virtually hidden by an appropriate configuration of the communication network. During this phase the memory management unit of the functional units takes care of supplying the source and destination block information to the network.

Figure 8:
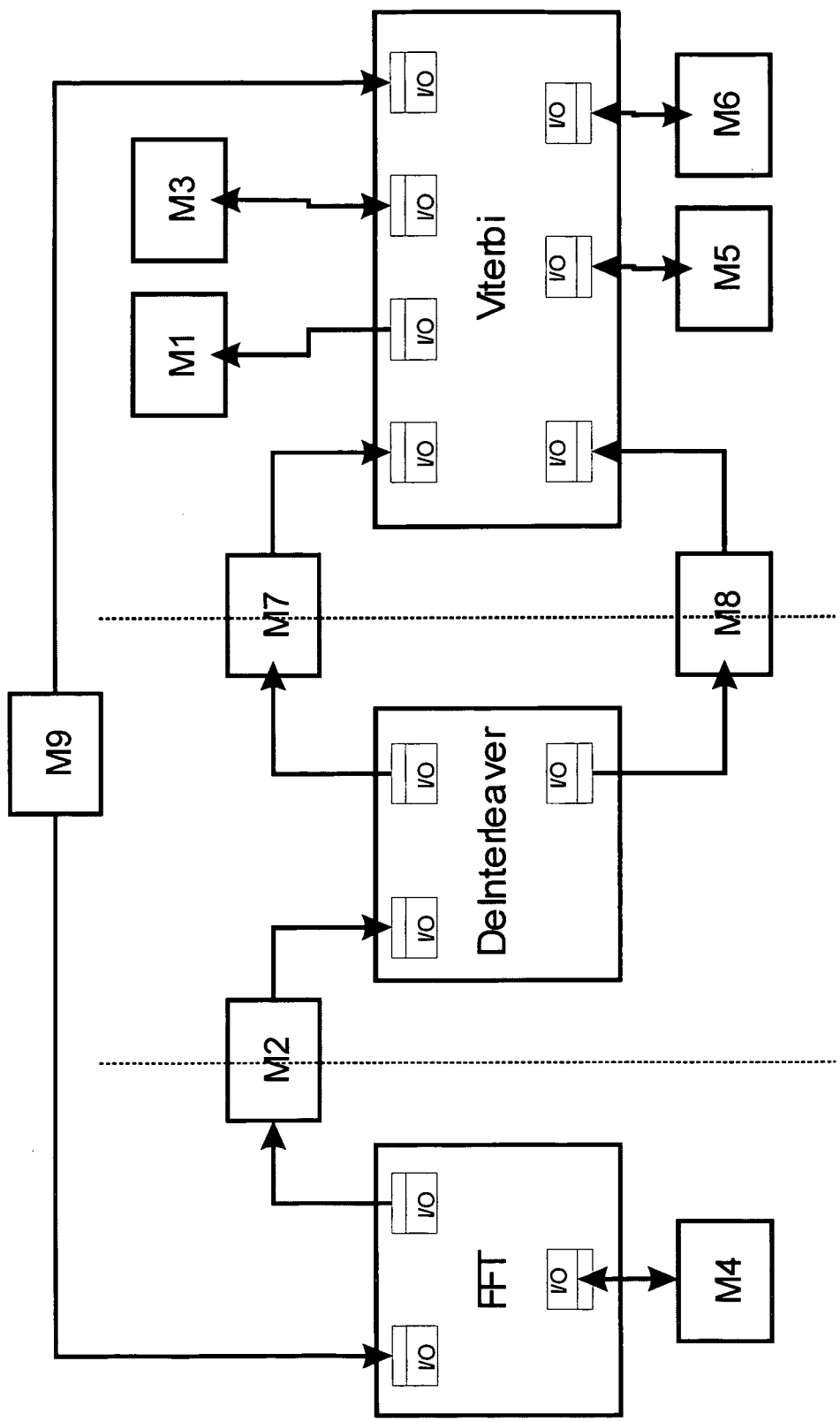
FIG. 8 illustrates the functional units of the application mapped to their dedicated memories.

In the case study with the DAB receiver (see below) which was implemented this memory management unit of the functional unit was implemented within the system-level-controller. The functional units themselves were abstracted away by simulating their I/O behavior. So the functional units itself are implemented as a Finite State Machine which communicates in a cycle-accurate behavior with the memories. The memory accesses in normal operation mode are simulated by the three different Finite State Machines which are representing the FFT, the Deinterleaver and the Viterbi of the application driver. FIG. 8 shows the different memories and their corresponding functional unit. The memory accesses were simulated by using this scheme.

Algorithms

A conceptual algorithm for the design-time and run-time phases of this scheme is shown in FIG. 9 resp. FIG. 10.

It is to be noted that this procedure is performed for relatively large system modules, so not for individual devices or even small circuits. Otherwise the overhead would be too large. But for the present invention, that granularity is also sufficient to deal with the issues addressed here. The effect of the variations on the correct operation of the individual devices should be taken care of during the circuit design stage itself (i.e. sufficient tolerance should be built in to keep on operating at least in a reasonable way). What is desired to deal with here are the overall C-Q-R (cost, quality, rate) axes that also influence the "correct operation" but from the system level point of view.

It is also to be noted that the monitors and the stored C-R-Q values in the trade-off surfaces, e.g. Pareto surfaces, do not have to be extremely accurate because the trade-off run-time controllers, e.g. Pareto run-time controllers, are quite "robust" to (small to medium) errors. The reason is that if at run-time a too optimistic/pessimistic point is selected at time $T_i$, the next evaluation at time $T_{i+1}$ it shall "notice" that too much/little slack is created compared to the actually imposed constraints. As a result, the trade-off control manager, e.g. Pareto control manager, can relax the trade-off working point, e.g. Pareto working point, to one of the "neighbouring" points on the trade-off surface. Under the constraints defined by control theory a system is robust as long as the errors are not leading to a positive feedback control loop. Given that the trade-off control manager should be activated frequently enough so that all "external" events are "sampled" enough, this assumption should be valid even for errors up to a few 10s of percent. Obviously, it will not work for 100's of percent but that is avoided by the above procedure.

FIG. 9 describes the design-time phase, generating so-called design trade-off information, e.g. Pareto information. FIG. 10 describes the calibration phase, determining so-called actual trade-off information, e.g. actual Pareto information, and the run-time phase, exploiting said actual trade-off, e.g. Pareto, information. The addition of the calibration phase is known in previous design-time run-time Pareto approaches. Also the deactivation of failing circuitry within the design digital system (being multi-module) is an additional feature.

In case of no application specific mapping tool can be used the following approach is still possible.

On some platforms, the vendor will not have full control on the mapping environment that designers use for their applications. In that case, it is not possible to incorporate the design-time exploration phase (which is application-specific) in the design/tool flow.

In order to still allow some savings, one could however use the following scheme. It is now assumed that the platform vendor is still prepared to include a heterogeneous distributed memory organisation on the platform.

The mapping environment or the designer himself will then still perform a specific assignment of the data to the circuit, e.g. memories. It is assumed that this assignment is expressed to a tool that converts this to a table that is stored in the program memory organisation of the embedded processor that executes the run-time trade-off, e.g. Pareto, controller dealing with the process variation handling. This run-time trade-off controller, e.g. Pareto controller, will 'redo' the assignment based on the currently available space in the distributed memories and based on their "real" spatio-temporal calibrated trade-off curves. That makes the complexity of the run-time trade-off controller, e.g. Pareto controller, larger because it also has to keep track of which space is occupied or not and it will also affect how global the optimisation can work.

The same concept can be applied for subtasks on processors or code segments on instruction memory hierarchy or block transfers on the communication network.

A conceptual algorithm for the revised design-time and run-time phases of this scheme is shown in FIG. 11 resp. FIG. 12. In essence the remaining flexibility in the platform at hand is exploited as much as possible, hence a simplified design-time phase is used, shifting some more effort to the run-time mapping.

In summary the invented approach splits the functional (which modules works) and performance/cost aspects of a part or the entire application mapping/platform design process.

Further the design essentially digital systems will include additional monitors for the C-R-Q axes, but since they are executed very infrequently, the energy overhead should be low.

The invention will work properly if the trade-off, e.g. Pareto, hyper-surface retains the same shape from the design-time simulation to the physical processed one (which can partly be included as a design criterium). If the change is too large, the use of a trade-off curve with offset, e.g. a so-called "fat Pareto curve", (incorporating non-optimal working points in the design trade-off curve lying within a predetermined offset of the optimal points) can be used to compensate for small shape changes.

As an example, an application on a memory device is now given in more detail.

The impact of the variation on transistors is straightforward. A transistor can become faster or slower, the threshold voltage can be shifted, etc. However, the nominal point will normally be relatively well centered in the middle of a "variation cloud". The impact on a memory is much more complex though. This is illustrated in the variation clouds for read and writes for a high-performance and a low-energy 1 Kbit memory (read operation illustrated in FIG. 13 and write operation in FIG. 14). For larger memories the range of these clouds increases, as decoder and sub-array sizes also tend to increase.

Memory matrices are complicated circuits, containing analog and digital parts. For small memories, the decoder consumes a significant part (over 50%) of the delay and energy. Moreover, in the memory matrix itself, the bitlines consume potentially much more than the sense amplifier (SA) because the SA is only active for e.g. 32 bits, whereas the bitlines span 128 bits (even in a divided bitline memory the bitlines span more than 1 word). Both components will now be analysed. In one of the largest digital circuits of a memory, the decoder, process variation always degrades delay, because many parallel outputs exist and the decoder delay is the maximum of all the outputs. The "nominal" design is the fastest because all paths have been optimised to have the same "nominal" delay. However, under variability, the chance of having one of these outputs reacting slower than the nominal one is very large. On the other hand, decoder energy is also degraded because the differences in the delays create glitches and this leads to energy overhead. The number of glitches is always larger than the in the (well optimized) nominal design hence also the "wasted" energy on these.

The analog parts of the memory (cell array and sense amplifier) are also heavily affected by process variation. The delay is normally increased because several bitlines are read/write in parallel to compose a memory word. If, due to variations, the driving capability of one of these cells decreases, then during the read operation the swing in voltage in the affected bit-line will be less in magnitude than in the nominal case. In this case the sense amplifier will require more time to "read" the logic value than nominally. Indeed, it would be necessary to have all active cells in the selected word to have a higher driving capability than the nominal one and that one to be larger than the delay occurring in the decoder so as to have a memory operation faster under variation than in nominal operation. The chance of having this situation is indeed very small, due to the typical large bitwidth (more than a byte) and the importance of the decoder both in energy and delay for small memories. Similar things happen during the write operation where besides the write circuit, the driving capability of the cell is also involved.

Figure 13:
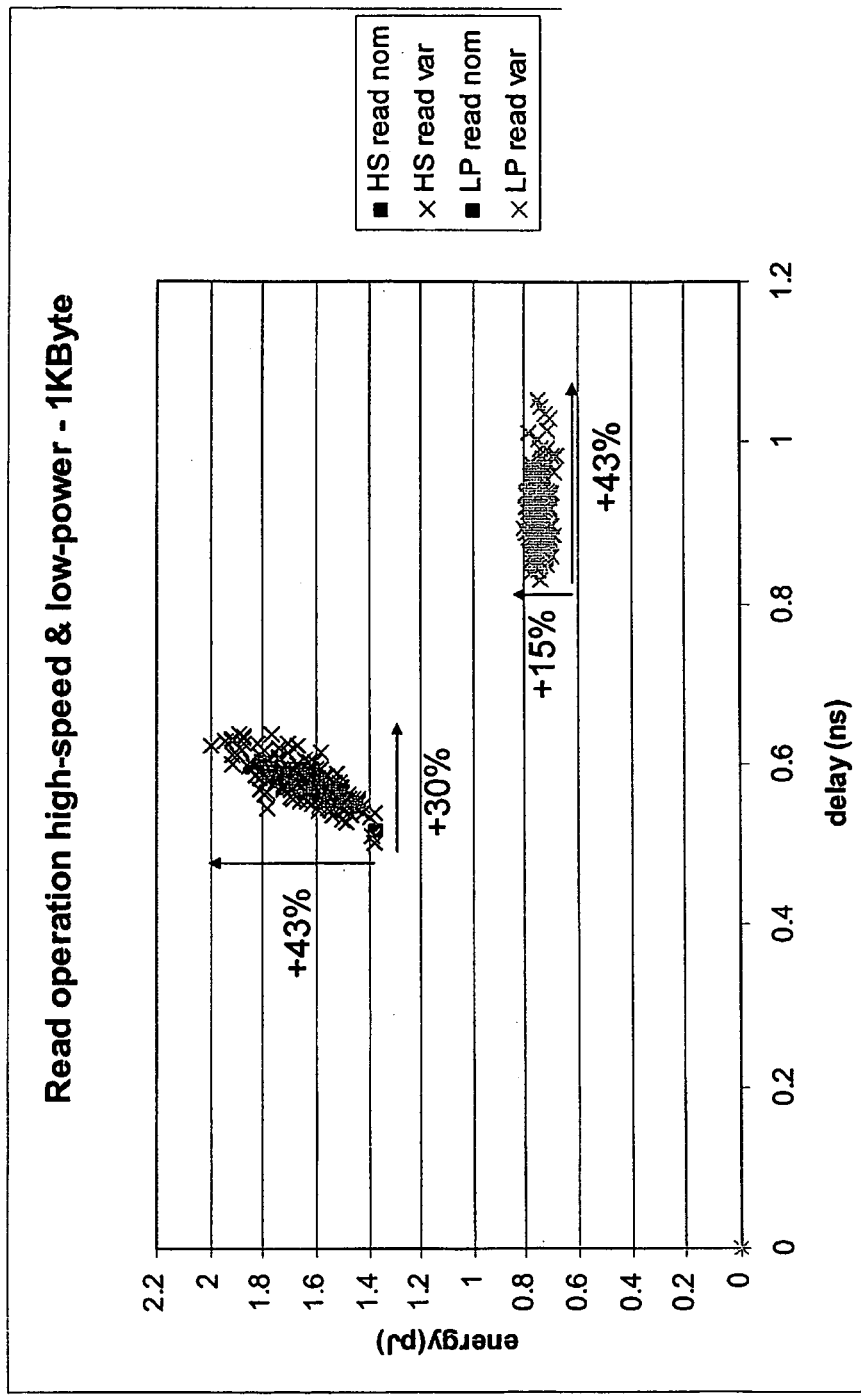
FIG. 13 illustrates the spread on energy/delay characteristics during read operations for a 1 Kbyte memory at 65 nm technology node (200 simulations). Two options are provided: high speed and low power.
Figure 14:
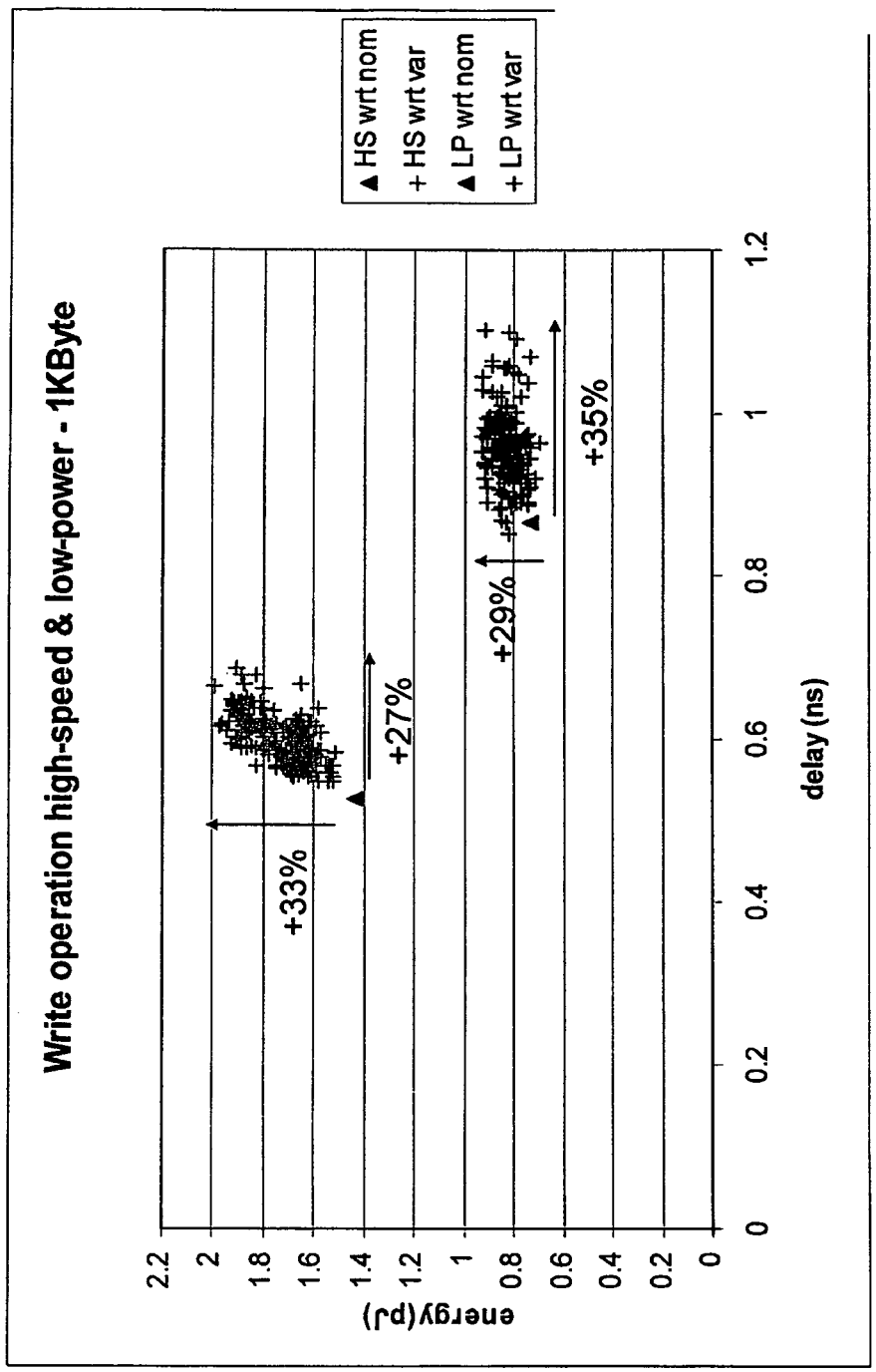
FIG. 14 illustrates the spread on energy/delay characteristics during write operations for a 1 Kbyte memory at 65 nm technology node (200 simulations). Two options are provided: high speed and low power.

For the energy the story is more complex. Due to the dominance of the memory matrix, it is now possible that energy is gained, namely when the swing becomes smaller in most active (accessed word in selected word-line) and non-active (non-accessed words in selected word-line) bit-lines. Hence, due to the smaller swing in these bit-lines the dynamic energy spent during the read operation in the memory matrix is less than in the nominal case. In that case, even when the SA has to spend more effort to detect the bit (it will take longer), the increase in energy in the SA is usually not enough to compensate for the decrease in energy the bitlines. So overall the memory matrix energy will have a good chance of an energy gain. Overall, the cloud is shifted mostly towards worse energy but a small part of the points exhibit a gain (FIG. 13+FIG. 14). Finally, the process variation also has an important impact on the timing control interfases that determine when the decoder has finished and the SA can be activated. This can additionally create yield problems.

Since process variations make memories slower and usually also less energy-efficient, the impact on the system will be similar. The total system energy is the sum of the memories' energy weighted by the number of accesses to each of them. Preferably this should be separate for the reads and writes because they have different behaviour (see FIG. 13+FIG. 14). The system delay is the worst case delay of all the memories that are active, since all memories should be able to respond in one clock cycle. If process variation cannot be compensated for at run-time, a worst-case is to be assumed at the design-time characterisation. Obviously not all extreme delay values can be counteracted, so typically a 3 sigma range is identified. This will determine a yield value after fabrication during the test phase, because all the points beyond 3 sigma range will be invalid.

In deep-deep submicron technologies, the yield problems are significant so vendors are moving to 6 sigma range for SRAMs. This makes the energy loss to meet a given delay requirement even larger compared to the typical/most likely "actual" points in the cloud.

The impact of process variation on the system energy consumption should be on average equal to that on the memories. If, for example, the memories consume 10% on average more energy due to process variation, the system will also consume 10% more on average. On the other hand, delay will be significantly degraded with a very large probability, due to its nature. If process variation makes one memory much slower, then the entire system has to follow and slow down significantly. This makes the loss of system energy to guarantee (within 6 sigma) a specific clock delay requirement at the system level even larger.

To avoid the above scenario, according to the present invention a mechanism is provided to recover the excessive delay that is introduced by solving the problem at the "clock cycle" level. According to the invention, a compensation for the effects of process variation is performed in the system level timing. For multi-media systems which are stream based this means for instance that it has to be guaranteed that every frame the outputs are computed within the given timing requirements. E.g. for the DAB 12M cycles are available per audio frame. If, at some frame, one or more memories go above the original (design-time) delay specification (which is now not selected worst-case any more), according to the present invention it should be possible to speed up the memories at run-time.

Figure 15:
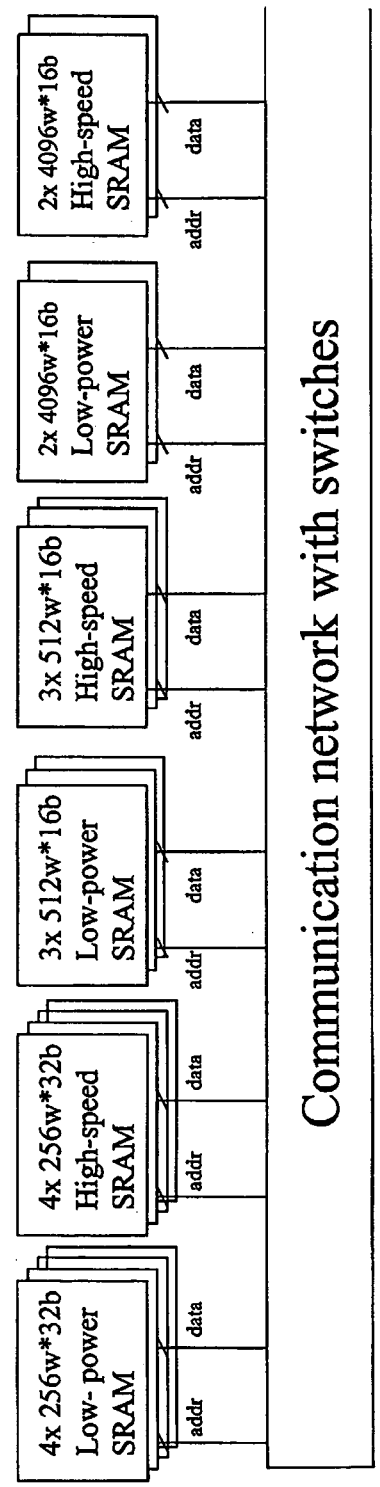
FIG. 15 illustrates a memory organisation for a DAB implementation showing 12×8 Kbit+4×64 Kbit SRAM memories in total.
Figure 16:
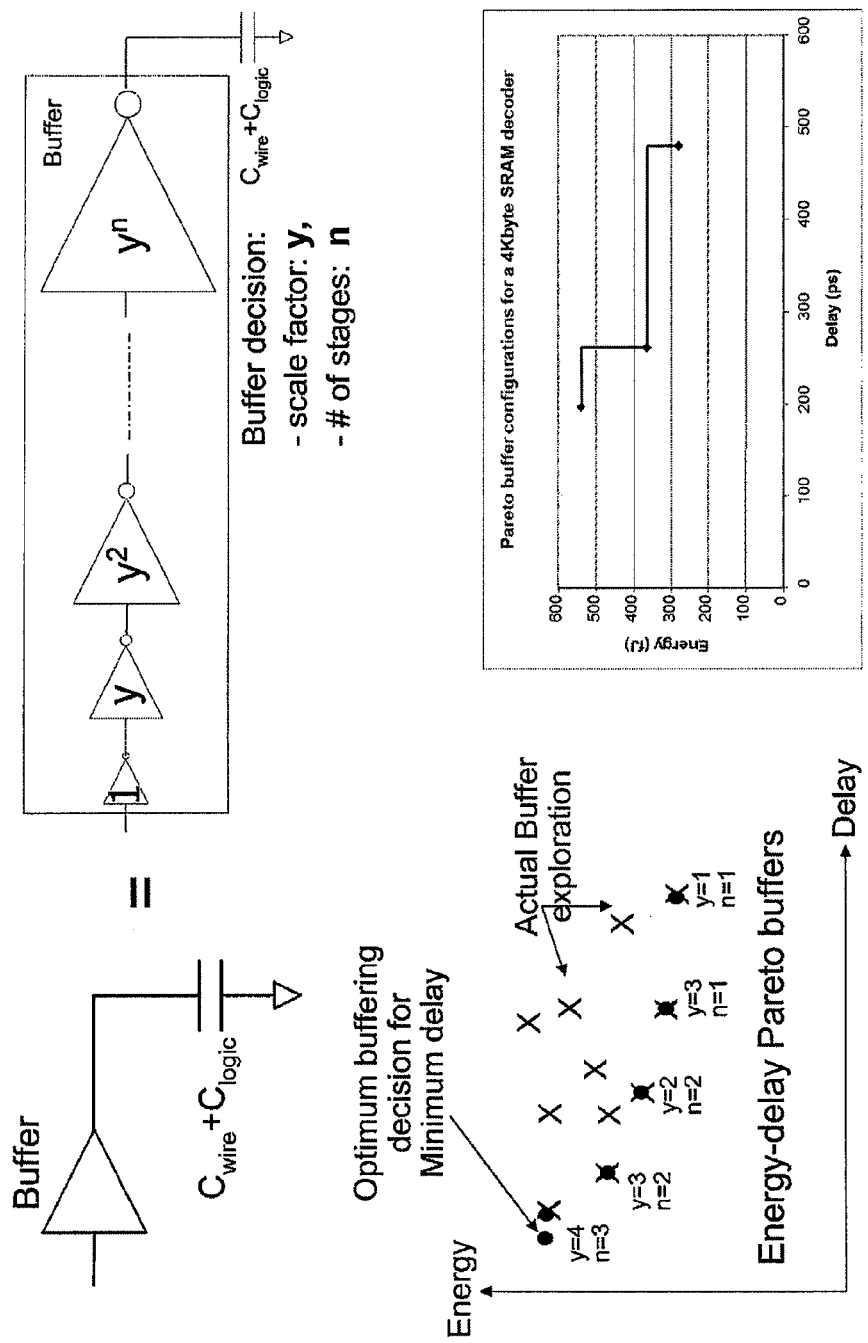
FIG. 16 illustrates Pareto buffer configurations for a memory decoder.

That can be achieved by exploiting the redundancy that is typically available in a given memory organization. In particular, that memory organization is dimensioned for the "worst-case" access bandwidth. But most of the time that much bandwidth is not required. So then several memories or memory banks can be powered down. According to embodiments of the present invention, these non-active memories will be used to give a "boost" when needed at run-time. Even more opportunities for such a boost are created by introducing a partly heterogeneous memory organization. The memories should be heterogeneous, especially in their nominal access delay to potentially compensate for the large delay increase caused by the process variation. For the DAB a memory organisation with 18 memories has been selected: 9 high-performance ones and 9 low energy ones (see FIG. 15). The potential to vary the memory behaviour is stimulated even further by providing "knobs" to the memories which allow a run-time controller to select a lower or higher delay. A typical example of that (which is quite cheap to implement in SRAMs) is the buffers that drive the internal decoder lines or the word and bitlines. These buffers can be designed to provide several delay-energy trade-off points. When the speed needs to be boosted, temporarily more energy is invested. An example of such a range is shown in FIG. 16.

Figure 17:
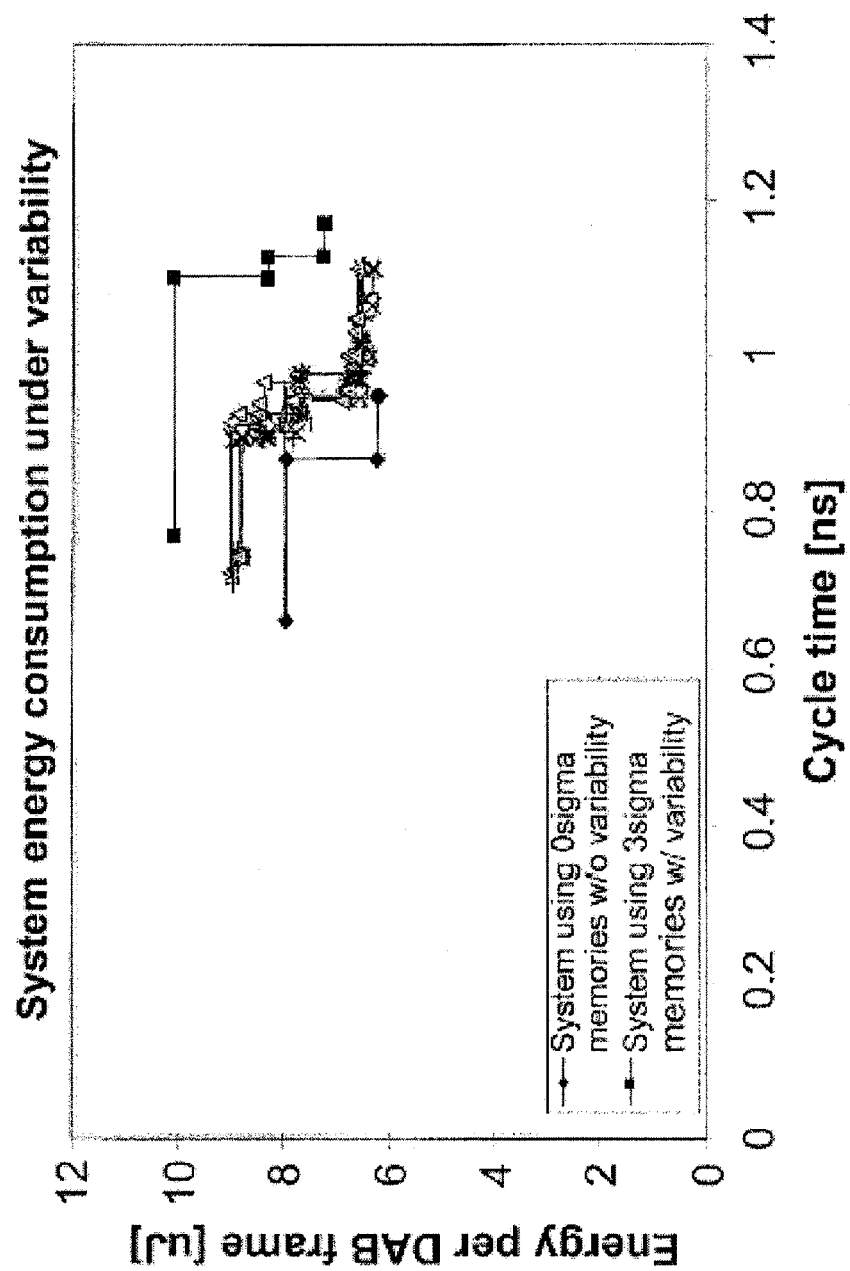
FIG. 17 illustrates design time Pareto optimal mappings for memories under process variation effects with emulated clouds.

Providing a variety of access delays that can be dynamically adjusted according to the exact run-time needs, enables a system-level run-time controller to find a number of memories that together can meet the required cycle-time, and such that the address space is also large enough to hold all the data of the application. But that "finding" cannot fully occur at run-time if it is desired to keep the energy efficiency. So a design-time exploration of a number of trade-off optimal cost/performance points, e.g. Pareto-optimal energy-delay trade-off points, that correspond to different mappings (with different values of the knobs). The design-time exploration may use SPICE based simulations where the process variation clouds are "emulated". Each of these trade-off optimal mappings, e.g. Pareto optimal mappings, is at design-time already stored in the program memory (in a compressed effective form). This leads to several trade-off, e.g. Pareto, curves that depend on the exact point that is active in the process variation "cloud" and that are quite different in position compared to the worst-case (3-sigma) curves (see FIG. 17).

The run-time controller that has to start up a new frame, first selects the appropriate cost/performance trade-off point, e.g. energy-delay Pareto point, and loads the corresponding program in the L1-I cache. In the worst case this has to change every frame (which is still only every 12M cycles for a 24 ms frame and 500 MHz clock for the DAB) but usually the same point will be valid for several frames even because usually the temperature effects will not cause that fast changes. So the L1-I loading is negligible in both energy and performance effect.

Figure 18:
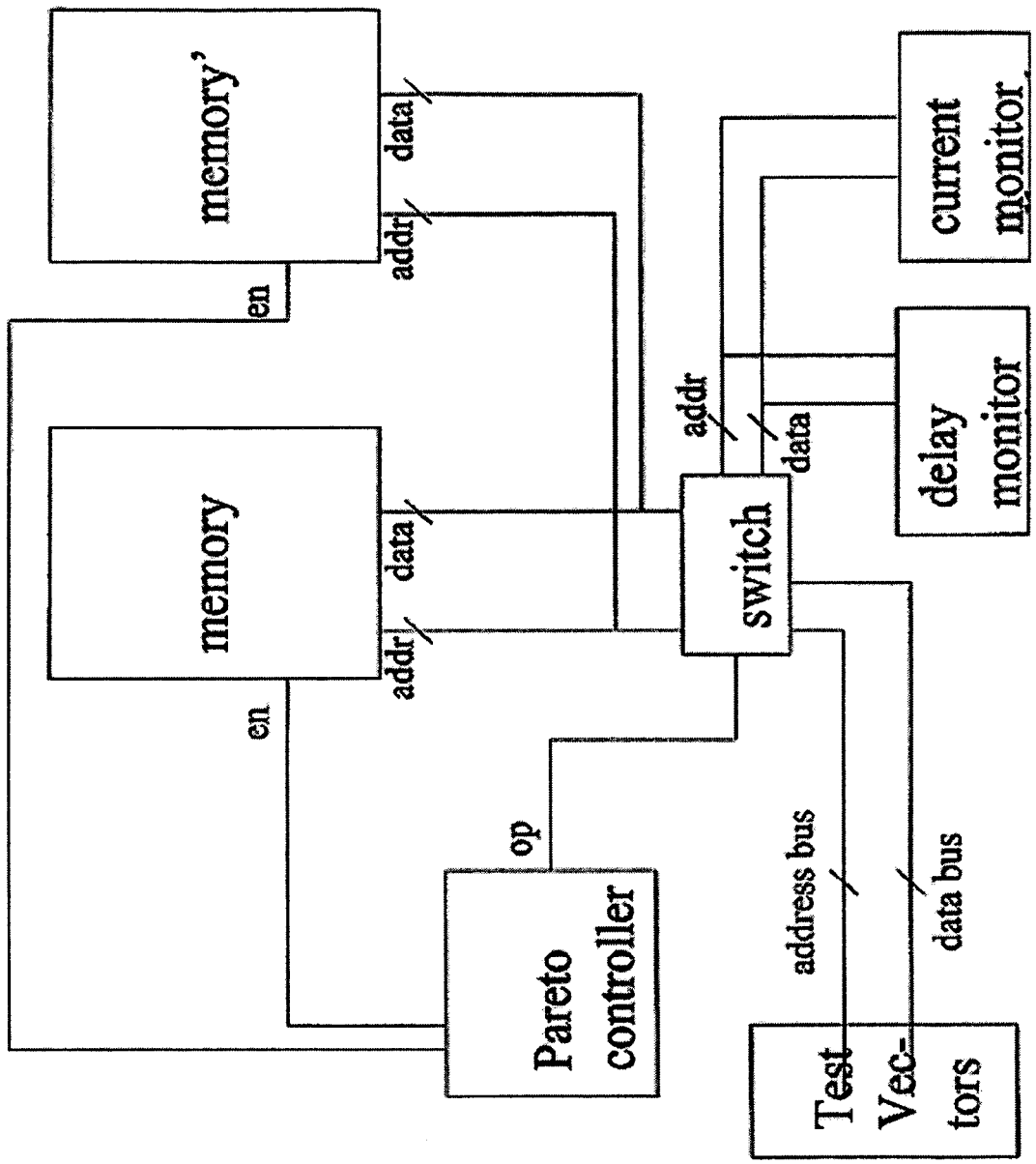
FIG. 18 illustrates a block diagram for run-time controller and calibration loop.

A calibration step may be added after the chip fabrication by using an on-chip calibration loop (see FIG. 18) and probably also once-and-a-while during the life-time of the chip because several effects like degradation will influence the actual cost/performance, e.g. energy-delay, positions of the trade-off optimal mappings, e.g. Pareto-optimal mappings. For that purpose, the same (few) test vectors that are used at design-time to determine the delay and energy of a memory are used at calibration time to measure these values with monitors. Delay can be monitored with delay lines that have been up-front calibrated from e.g. a crystal and that are designed with wide transistors so that the delay lines are not influenced much by further variations. The energy monitor is based on current measurement, also with wide transistor circuits. The calibration should be done separately for read and write operations.

Now a characterization methodology is discussed to be used in the methods discussed above.

Technology process variations introduced during the fabrication of CMOS wafers such as fluctuations in doping and material properties, mismatch in transistor dimensions and alike cause transistor performance and energy consumption to deviate from their nominal values. For Deep Sub-Micron (DSM) technologies this variability becomes much more prominent making digital circuits and systems more difficult to predict and control.

The analysis of the impact that this variability has on the performance and energy consumption of common IP blocks such as ALU's is relatively new. For SRAMs the focus has been mostly in yield issues, where the sensitivity of the SRAM circuits, esp. the SRAM cell stability, to process variability and the design rules to compensate that gained most attention.

However, SRAMs are performance and energy critical components in modern SoCs, contributing most to the delay and energy consumption of the system. Thus, studying and understanding their performance and energy behavior under the influence of process variation is key to achieve successful system design.

It is now investigated how the variability in the electrical properties of the transistors (e.g. threshold voltage Vt and current factor Beta) make the actual energy and delay per SRAM (read/write) operation to drift from the expected nominal value. Indeed, neighbourhood transistors in the same die (intra-die process variability) can become faster or slower or consume more or less energy hence leading to an uncorrelated "variation cloud" with the nominal point well centered in it. Even when such effects are expected to manifest also in a similar way for more complex blocks like SRAMs, this is however not the case. Indeed as shown here, these effects manifest at the block level even more dramatic (bigger spread) than at the transistor level, resulting also in variation clouds. However, in the case of SRAMs (and memories in general) all points become in practice slower and with more energy than the memory not affected by variability (hereafter called the "nominal" memory).

With the present invention it is the first time that the different (global) interactions originating from variability effects at the electrical level inside and between the different blocks of a memory (e.g. cell array, decoders, sense amplifiers, timing interfaces) is analyzed. The impact of these effects on both energy and delay for SRAMs of different sizes and types at the 65 nm technology node is quantified. For this purpose, an experimental methodology is proposed to characterize SRAM energy and delay under process variation effects. Experimental results obtained from HSPICE simulations show that process variation tends to significantly increase the delay and energy consumption of the memory compared to the nominal values in the large majority of the cases. This is the first time such none-intuitive SRAM behaviour due to process variation is obtained in a generic way.

Process variation impacts many technology parameters. The focus here is on those related to the transistors, the effect of variability in the interconnect wires is neglected here since its impact in the back-end processing is expected to be less dramatic than in the front-end. This is true for the long interconnect lines such as bit-lines, word-lines or decoder busses that are typically large enough so as to average variability effects. Impact of variability at transistor level can be reflected in deviations in the drain current. This deviation can be modeled using the threshold voltage (Vt) and the current factor (Beta), which depends on several physical parameters (Cox, mu, W/L). A first order analysis shows that the variabilities of these two electrical parameters are dependent on transistor area. Furthermore, they both follow a Gaussian distribution and have the following standard deviations: sigmaVt=DeltaVt/sqrt(WL), sigmaBeta=DeltaBeta/sqrt(WL) where W,L are the width and length of the transistor.

At the 65 nm technology some in-house developed characterisations of the technology node towards (intra-die) variability impact has been performed by the applicant, and estimated values for DeltaVt and DeltaBeta/Beta have been obtained. Given these estimates a 1-sigma variation (defined as the value for increase/decrease from the nominal point that defines a region of values where 50% of the population of transistors fall within) and for the smallest representative transistors of that technology leads to about 10% drift from their nominal value in both Vt or Beta. These minimum sized transistors are very common in SRAMs in order to achieve maximum density, making these memories very vulnerable to the impact of variability.

The modeling of variation in threshold voltage Vt is straightforward in HSPICE since it is a parameter in the model card and an offset to that value can be explicitly specified at the netlist level. However, Beta can only be modeled in HSPICE via physical parameters. The oxide capacitance (Cox) and mobility (mu) cannot be modified since they are correlated with other transistor parameters like gate capacitance. Therefore variability in Beta must be modeled implicitly. Since Beta is proportional to the aspect ratio of the transistor W/L it has been chosen to model that variability as changes in W/L such that WL is constant. This ensures that the first order contribution of the extrinsic load driven by the transistor is not influenced by the variation in Beta, which is in fact physically the case.

Figure 19:
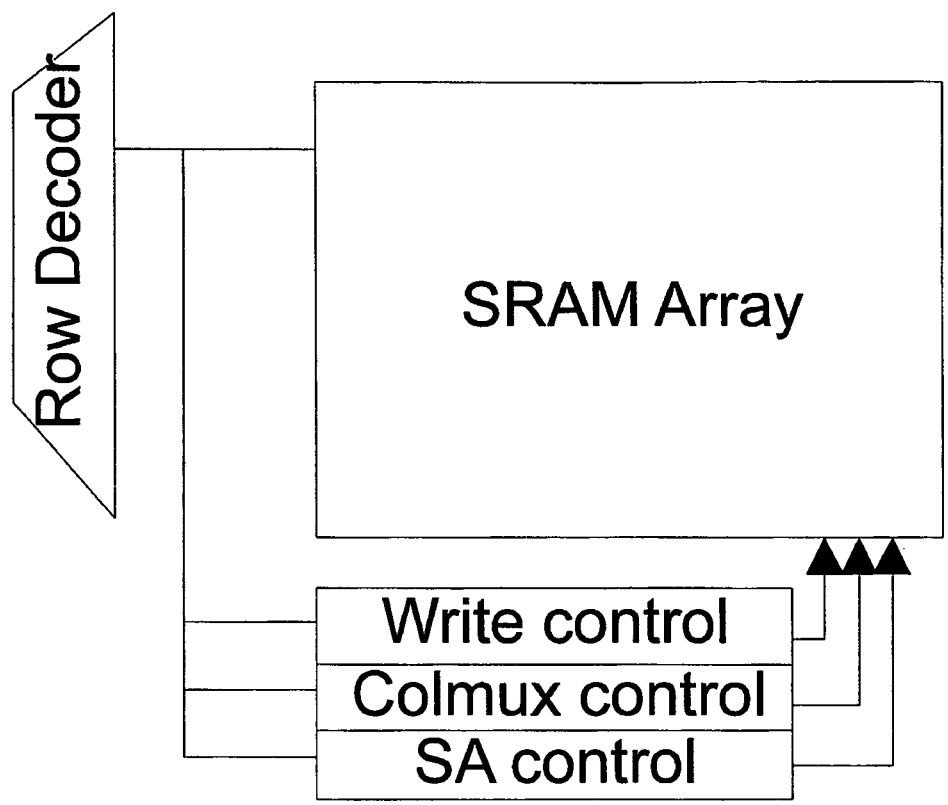
FIG. 19 illustrates a self-timed control interface.

The SRAM architecture considered for analysis is the cell-array partitioned architecture typically used in industry, and described in B. Prince Semiconductor Memories: A handbook of design, manufacture, and application, second edition John Wiley and Sons, 1991. In this architecture, the row decoder is split in two stages, with a predecoder stage composed of NAND gates and a postdecoder stage composed of NOR gates The cell-array is composed out of parallel bitlines and wordlines with the cells (classical 6T SRAM cell design) dimensioned to perform stable operations at the 65 nm technology node. The timing control interfaces uses a self-timed style described in by Steve Furber in "Asynchronous design for tolerance to timing variability", ISSCCO4 Advanced Solid State Circuits Forum, generating not only a short pulse for the wordline but also other control signals according to the row decoder output (see FIG. 19). The precharge circuit, column mux and write circuit in the array are also optimized for the technology node and SRAM size. The (voltage) Sense Amplifiers (SA) and tri-state output buffers used are designed for the 65 nm node as well.

Figure 20:
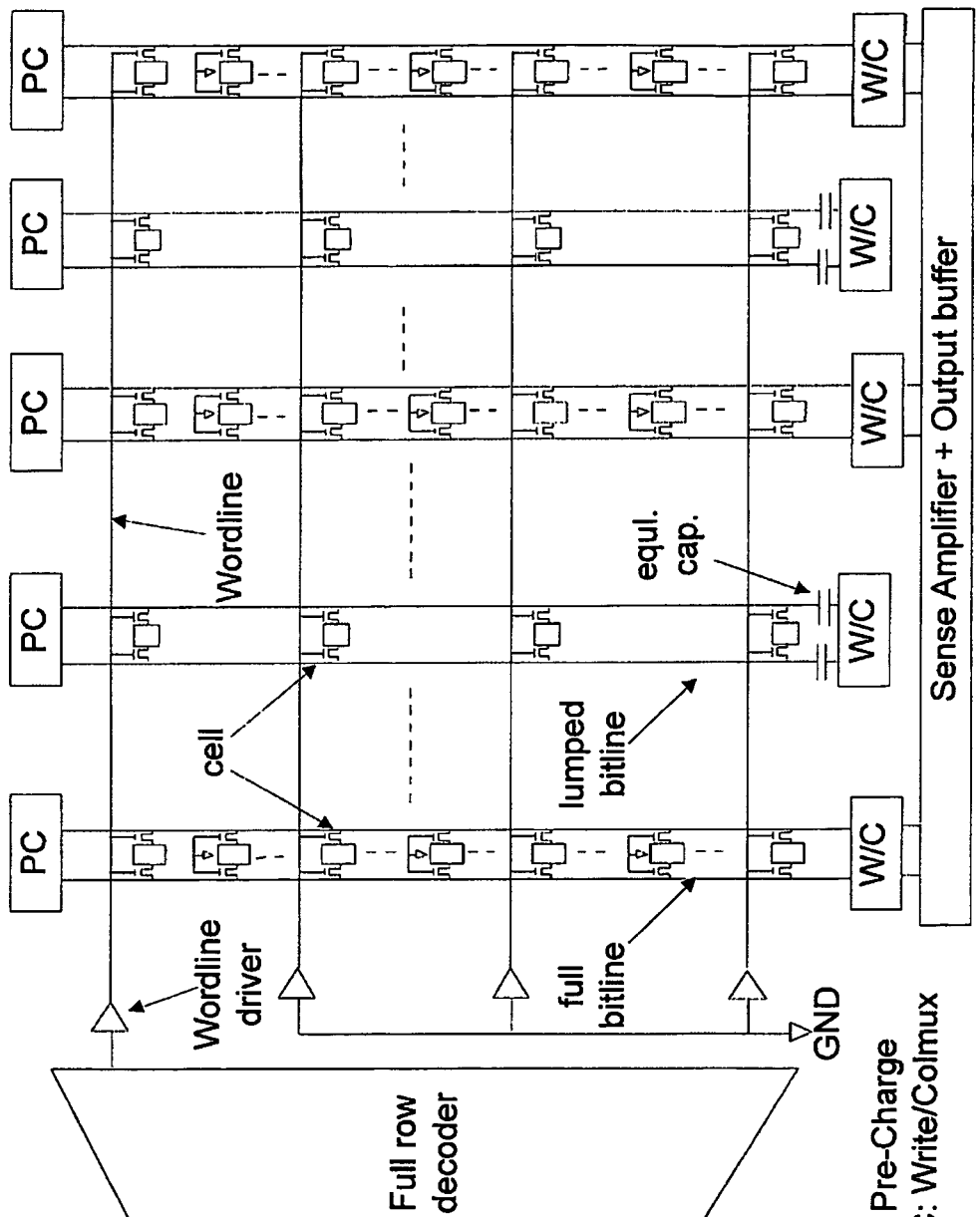
FIG. 20 illustrates a lumped SRAM model.

HSPICE simulations of the full SRAM is not practical for analysis of the process impact due to the many simulations required to gather data with reasonable statistical significance. Therefore, for the purpose of speeding up simulation time without sacrificing much accuracy, a lumped SRAM model (see FIG. 20) targeting less simulation time and with still reasonable accuracy is developed for this analysis. This model is composed out of a full row decoder plus a simplified cell-array where the number of wordlines is just a fraction of the ones present in the full memory and they are equally distributed along the height of the cell-array. Still, it should be mentioned though that results with from HSPICE indicate that this lumped model achieves more than 97% accuracy in average with a factor of 12 reduction in the simulation time compared to the full SRAM simulation.

The critical path of the SRAM starts from the row decoder and ends at the output buffer in the array. The delay of this path under process variations can be obtained in the netlist by connecting the row decoder critical path with the array and finding the delay of the slowest output out of all parallel outputs of the array.

1. Decoder Characterisation

The first issue in this step is to find the worst case decoder delay (hence the critical path) under process variability. This is not a trivial task as the decoder critical path depends not only on the input address but also on the transition from the previous address. This is because such transition changes the (dis)charge paths of the parasitic capacitances of the decoder netlist, and hence affects the actual delay. A worst case transition exists for a netlist not subject to variability and that is always the same. However, under variability that is not necessarily the case. The reason is that many parallel decoding paths exist in the combinational decoder. Hence, the slowest path that determines the row decoder delay is different depending on the variability. Finding this critical path or slowest output actually means finding a worst case delay transition that excites this output for each netlist injected with a different variability set.

A first analysis on the number of possible combinations leading to worst case response would require 2 over 2 over N simulations for a N-input decoder and that for each netlist where variability has been "injected" in the Vt and Beta of each transistor. Even for small decoders, this characterization is unfeasible. Therefore a methodology is required to find the critical path with the smallest possible number of vectors. For that purpose a heuristic has been developed based on decoupling the search for worst delay output for a given address from that one for the worst delay transition, irrespective of the output selected.

With this basic approach, an experimental methodology to obtain the right combination under variation is developed as follows:

1. Consider set of all possible worst case delay transitions for full decoder assuming all outputs have same delay.
2. Identify the worst delay vector that excites the slowest output under variation by an experimental heuristic.
3. Combine the set of worst case transitions with the worst case delay vector to find set of transitions where the worst case delay of the decoder can be found.

Now the above steps are described in more detail.

Step 2: to obtain the worst delay vector in step 2, exercising all decoder outputs one by one is not a time efficient solution since the number of combinations grow as 2 over n, n being the number of address decoder inputs. To avoid an expensive search, a heuristic has been developed which is based on exciting all decoder output at the same time and finding the slowest of them. This is done by violating the decoding rule in such a way that all input address bits and their complemented bits (see FIG. 21) are supplied with the same 0-1 transition at the same time no matter a particular input should be complemented or not. This can be easily implemented with low cost at the circuit level by adding multiplexed inputs in the gates of the predecoder that will supply the normal values under normal operation and the all-1 (1 . . . 1) vector under test phase. The all-1 vector will be used to excite all the decoding paths in the decoder that will allow activating all the outputs in one time without wasting time by trying it one by one. By monitoring the difference in delay of all the outputs, the slowest one can be easily identified. Based on this output, the worst delay vector can be obtained by backtracking the decoding process. Input address transition will not play a role in the determination of this vector because the same transition (0-1) is applied for all the outputs.

Step 3: finally, the worst case delay transition set under process variation can be obtained by generating a set of 2 input address vectors. The first vector of that set is the initial vector exercising a worst case transition (of the possible set of all possible worst case transitions) irrespective of the decoded output (see Step 1). That one is then followed by the vector selecting the worst case output (see Step 2). For energy the set of vectors selected is different but still based on the one found for delay. In fact, for energy, the worst decoder transition is obtained by applying two vectors, where the second vector is the same as for delay. Only the first vector is different, still obtained by complementing the first of the vectors for worst case delay. That should lead to opposite switching direction in the nodes of the netlist while creating maximum activity in these nodes.

2. Full Memory Energy/Delay Characterisation

Similar to the decoder, finding the delay of the array under process variability using a full search of all the cells, sense amplifiers, etc. is impractical. Hence, there is no better alternative than using a local search where decoder and cell-array interactions are neglected. However, in practice given enough number of statistical simulations, the worst case delay range of both decoder and the cell-array when simulating both together can still be captured.

For that purpose, the delay of the SRAM is obtained as follows: (1) a nominal lumped netlist of the memory is first instantiated; (2) random variations on the transistors of that netlist are injected generating a netlist for a given variability; (3) the decoder of that netlist is analysed and the worst case delay and energy transitions are found following the methodology described before; (4) once the decoder output with the worst case delay for a given variability scenario is identified, then a new netlist is generated by connecting that (slowest) output with the one of the four wordlines of the lumped cell-array netlist; (5) the write delay is measured from the moment the input address is given to the moment when the last cell in the accessed bitlines becomes stable; (6) the read delay is measured from the time the address is given to the time when the slowest data bit is read out among the all the parallel bitlines. To capture the SRAM energy/delay with enough accuracy, 200 simulations have been performed each time picking a different process variation drift for each of the parameters for each transistor. Given Monte-Carlo analysis this should bring a confidence factor above the 99% since that one is inversely proportional to the square root of the number of experiments.

To evaluate the impact of process variability at the SRAM level, a 1 KB 32 bit wide SRAM has been simulated following the strategies defined the in previous sections. This SRAM and its timing is designed for the nominal point instead of for the three or six-sigma worst case design.

Figure 21:
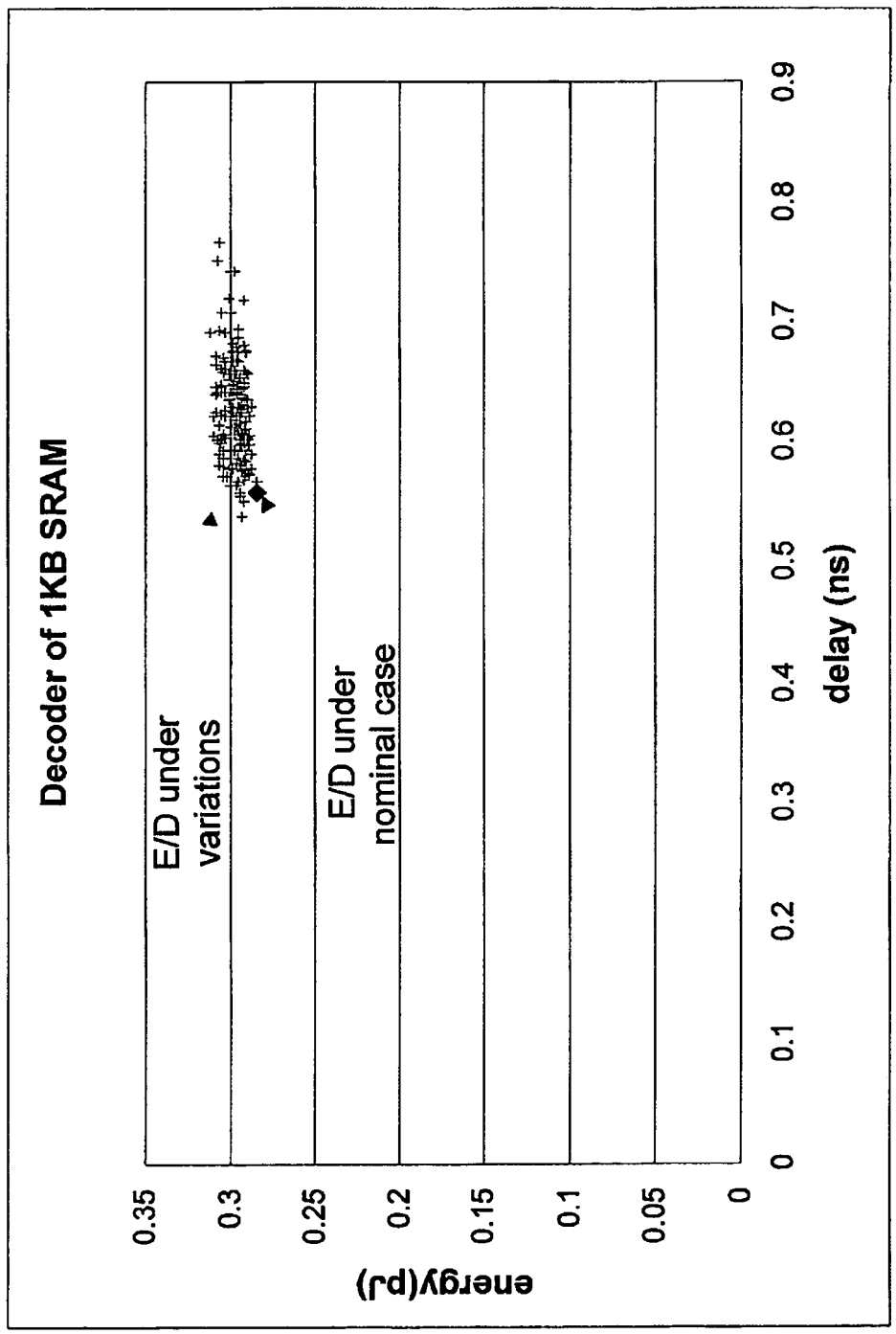
FIG. 21 illustrates decoder energy and delay under process variation.

The experimental results shown in FIG. 21 indicate that decoders under process variation tend to have larger delay and energy than the nominal one. The increase in decoder delay is because the slowest path of the decoder under variability will be slower than the one in the nominal decoder for most cases. The energy increase is due to the fact that reconvergent decoding paths have different delays induced by process variation. This difference in delay leads to glitches when they converge at one gate. This wasted energy leads to the increase in overall decoder energy.

Figure 22:
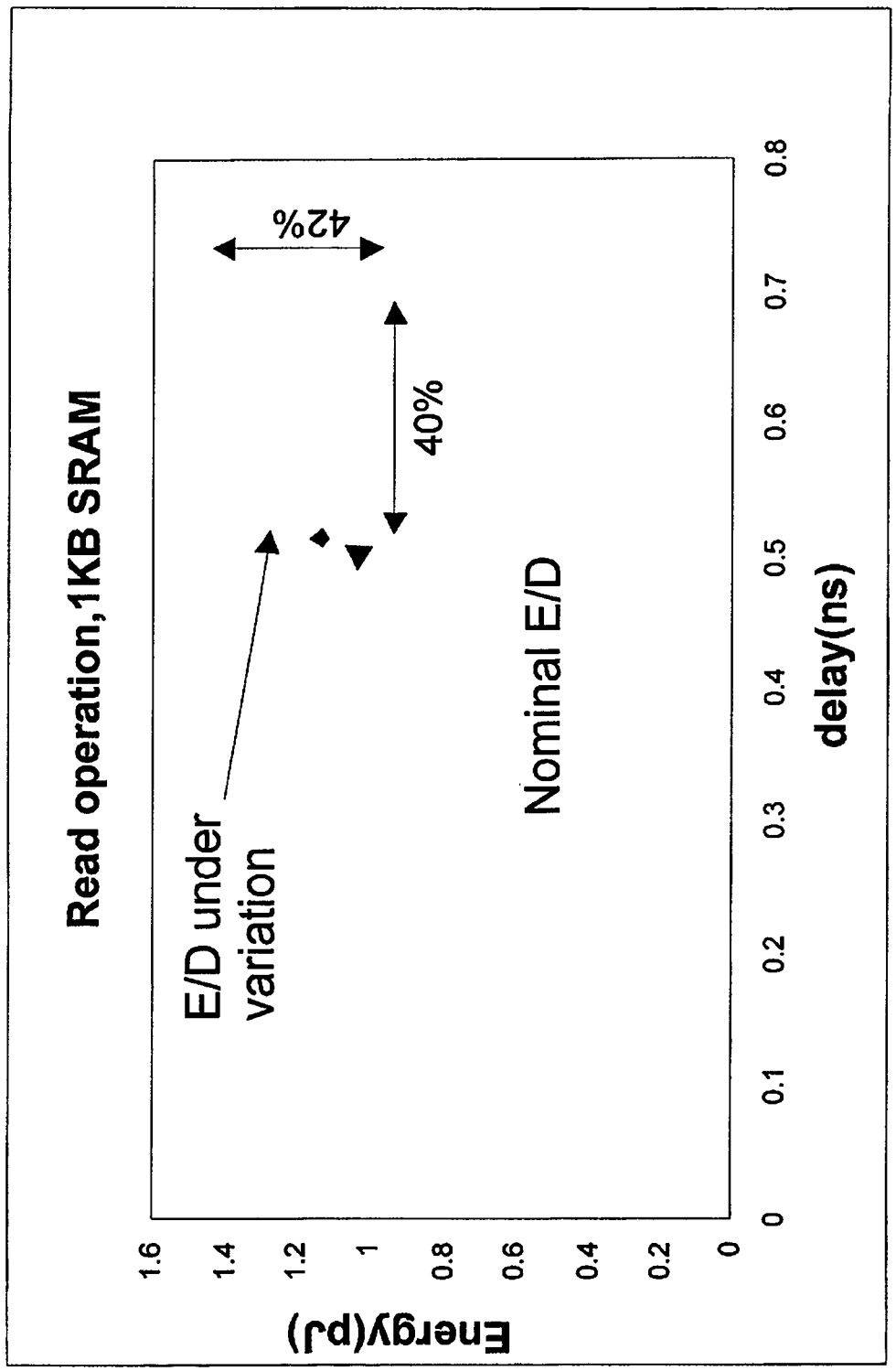
FIG. 22 illustrates SRAM energy/delay characteristics for read operations under process variation.
Figure 23:
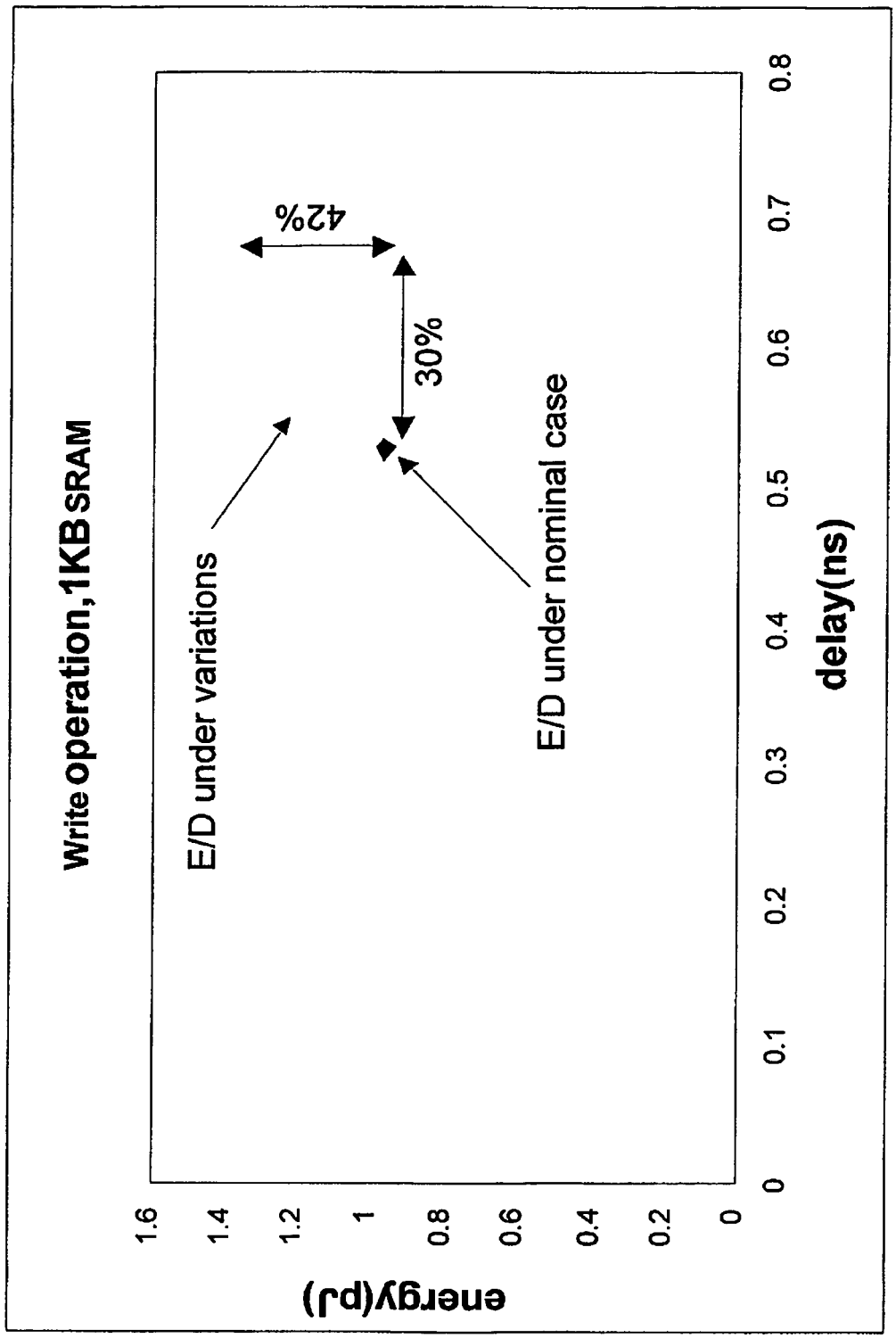
FIG. 23 illustrates SRAM energy/delay characteristics for write operations under process variation.
Figure 24:
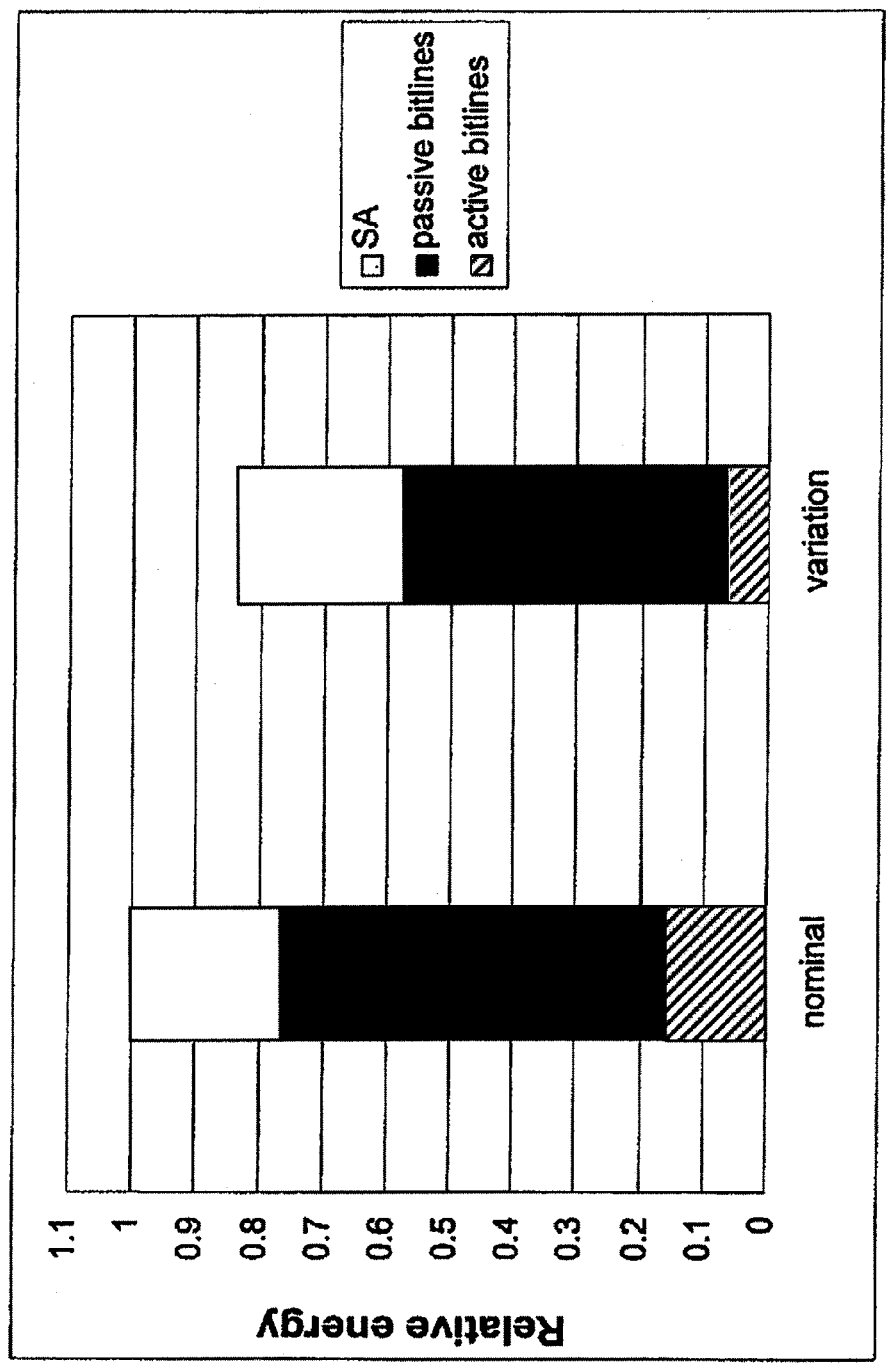
FIG. 24 illustrates array read energy (relative) breakdown under nominal case and under variation where overall energy is smaller than nominal.

The delay/energy cloud of the memory for read and write operation are shown in FIG. 22 and FIG. 23 respectively. According to the clouds, the delay of both operations tends to become slower in most cases. This increase in delay not only comes from longer decoder delay but also from the larger array delay. In the read operation, the array tends to have larger delay because in most cases the slowest bitline among the parallel ones being read is slower than nominal case. The increase in delay is due to the fact that sense amplifiers need more time to sense the smaller-than-nominal voltage swings on this particular bitline to full rail. This smaller swing is due to several effects, even a combination between them. For instance, the bitline discharge current can be reduced due to the pass transistors conducting later than nominally (due to a higher Vth than nominal). Also, the inverters in the cell can have less driving capability due to the impact of variability in Vth. As it is very much likely to have one of the full-word bitlines slower than the nominal case, the read delay is for most cases larger than nominal. The energy of the read operation is dominated by the energy consumed on the bitlines including both the active ones (these being selected by the column muxes) and the passive ones (these not selected). When bitlines have larger swing than nominal, they consume also more energy than in the nominal case to discharge the bitline load. When bitlines have less voltage swing, they also consume less energy. The higher read energy in the cloud is due to the fact that most bitlines under that variation have larger voltage swing making the overall energy contribution to increase. The cases where the read energy is lower than the nominal case, most bitlines have less swing than nominal under those variations, leading to a decrease in bitline energy. Although the SA needs more energy to amplify these smaller swing to full rail that one is not yet enough (in their global contribution) so as to compensate the decrease in energy obtained in the bitlines due to the smaller swing. This balance is illustrated in FIG. 24 for a nominal memory and another one under variability where the read energy is less than nominal. Still in most cases the energy consumed in the read operation is higher than nominal since the contribution of the decoder is also significant and in many cases the gain in the cell-array is not enough so as to compensate the excess in the decoder.

In the write operation, delay has the same trend as in the read operation for similar reasons. For instance, one end of the cell is directly grounded by a large transistor in a very short time. While the other end of the cell has to be flipped by one of the inverters in the cell. Affected by variability, that inverter in the slowest bitline has less driving capability than nominal case, which results in the cell taking more time to get totally flipped. All bitlines would be required to react faster than the nominal bitline and that gain in delay would be required to become larger than the excess in the decoder so as to have an overall memory with a faster reaction time than the nominal memory. That is in fact extremely unlikely to happen as simulation results confirm.

The impact in energy for a writing operation is however different than in the read operation. Here (write operation) almost all cases consume more energy (see FIG. 23). This is due again to a global interaction of local effects. During the transient flipping process, short-circuit current flow will induce a waste in energy consumption. For fast bitlines that leads to both ends of the cell to flip quickly. In that case the voltage slope in the node between the two inverters of the memory cell can become much shorter than the one present in the nominal memory which decreases the short circuit current between the pull-up and pull-down transistors of the inverter of the cell that it is involved in the write action. Together with the fast flipping time, the energy of such bitline is less than nominal one. On the contrary, the cells in the slow bitlines takes longer to flip and the voltage slope at that node between inverters is much larger than the nominal case. Therefore the short circuit current due to this slow slope will be much larger, also flowing for much longer time than nominally. Overall the difference in energy waste in the slow write operation with respect to the nominal operation is, in absolute magnitude significantly bigger than the "gain" in energy waste happening in the fast operation with respect to the nominal case. As a result, almost all bitlines would have to be reacting faster than the nominal one to have a net energy gain.

SRAMs tend to be slower and consume more energy on average than their nominal implementation in most cases under process variation. This is partly counter-intuitive and no existing literature describes this in a systematic generic way. Hereinabove the different mechanisms behind this unexpected behavior have been identified and illustrated at the module level and the impact of these effects has been quantified for on-chip SRAMs at the 65 nm technology node.

System Circuit and Architecture Implementation

An architecture for monitoring a circuit is provided. A developed architecture for an experimental setup with a DAB receiver is described in detail. In the following FIG. 25 the final architecture of the system including the simulated functional units of the DAB receiver is shown. However, it is not intended to limit the present invention to this particular architecture. From the description of the architecture below, a person skilled in the art will be able to build other architectures for other circuits.

The architecture of the system including the simulated functional units of the DAB receiver includes the nine memories which are required by the DAB receiver. To provide the DAB receiver with a parallelism of three parallel data transfers the memories are grouped into memory domains and each domain is assigned different address and data busses. These three pairs of busses have their own delay monitor to avoid inaccuracies due to different wire lengths of the busses. Via the input/output-ports of the system the simulated functional units are connected to the busses.

Figure 25:
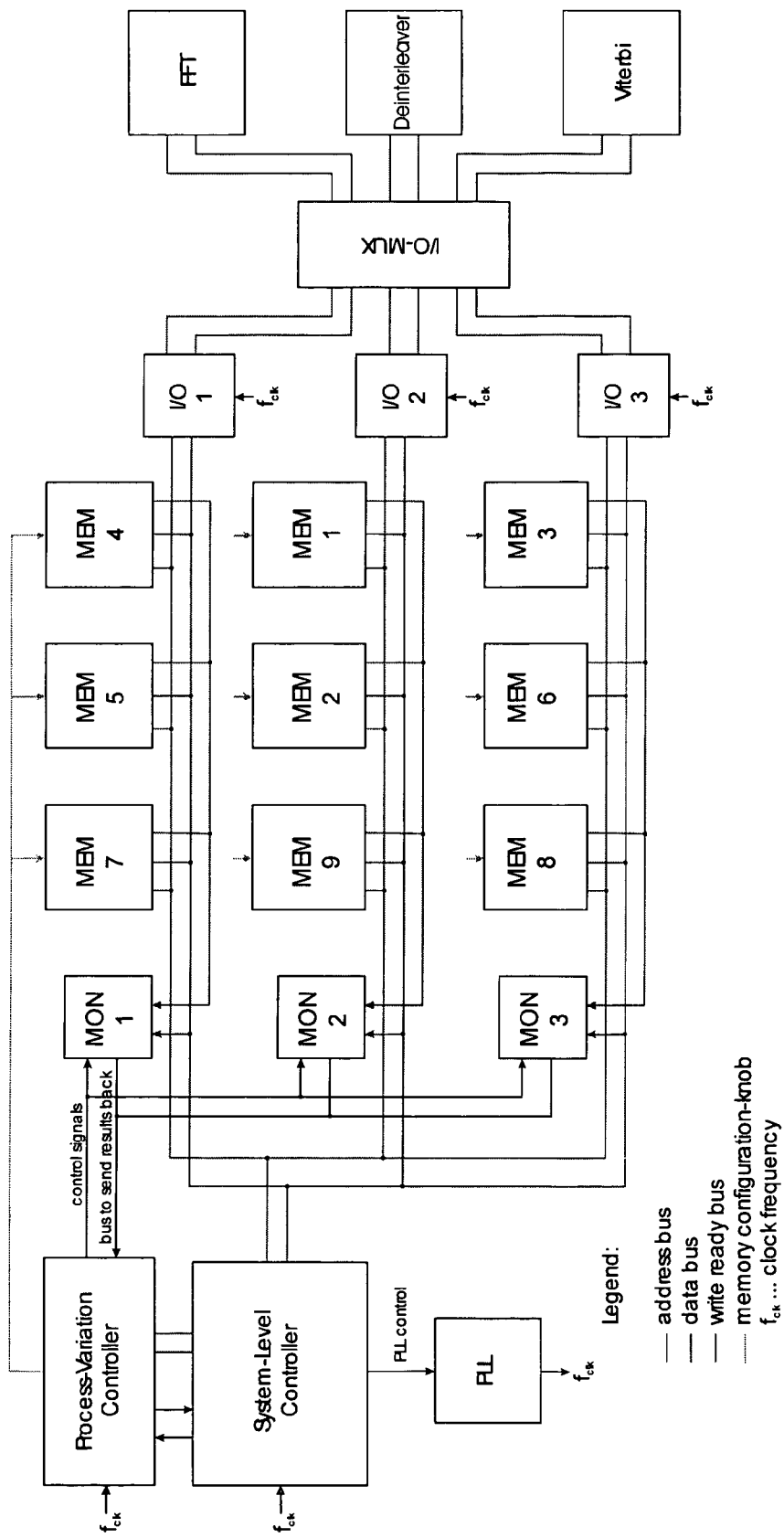
FIG. 25 illustrates an architecture of a system according to an embodiment of the present invention for an experimental set-up with a DAB.

The components shown in the architecture illustrated in FIG. 25 are described in the next paragraphs.

Energy and Delay Monitors

To measure the energy consumption of an access to a memory, an energy monitor is needed. The energy monitor is connected to the power supply of each memory. Potentially one energy monitor per memory might be required for more accuracy in the measurement results. It also needs information about when to start and when to stop the measurement in order to provide sufficient results. Only a simulation of an energy monitor is implemented in the VHDL description of the system, because energy related behavior cannot be simulated in VHDL. Therefore just a register file which contains information about all the different energy consumptions per access of each memory is read by the monitor. To synchronize the monitor with the current memory under test in order to get the correct energy values out of the register file a synchronization with the clock of the system is necessary. The different maximum energy values for read and write for the slow and fast configuration-knob are stored in registers. After the measurement of one memory is completed the content of these registers is sent to the process variation controller (PVC). After the measurement of all memories in the design the PVC has information about all possible configurations in terms of energy for the complete memory architecture. The energy values are sent to the PVC via a dedicated bus. This could be optimized in future by sending the values over the data bus which is not in use during the time the values are sent back and which is connected to the monitor anyhow.

For the measurement of the delay of the memories, a delay monitor based on the work of M. A. Abas et al., "Design of sub-10-picoseconds on-chip time measurement circuit", Proc. DATE, vol. 2, pp. 804-809, February 2004, is used. As mentioned before, three delay monitors are introduced in the architecture to avoid inaccuracies due to different bus lengths. The principle of measurement which was presented above is used.

The monitor itself consists of two separate chains of delay lines and it measures the time difference between the rising edge of two different signals. The first signal, called start signal is sent through a slower delay line chain and the second signal, called test signal through a faster delay line chain in order to catch up with the start signal. Comparators are introduced along these chains. When the test signal catches up with the start signal the respective comparator output becomes true. So the output of the delay monitor is a so called thermometer code gained from all single comparator results. The time difference between the two edges is then calculated as the number of delay line times the delay difference between delay lines of the fast and the slow chain.

This delay monitor can measure the delay difference between two one-bit signals. So the granularity of the measurement is defined by the delay difference between the fast and slow chain. The delay of the stages of the fast line is 50 psec, for the stages of the slow line it is 100 psec. Therefore the accuracy of this circuit is 50 psec which is sufficient given the performance of current embedded memories. One stage of the delay line chain consists of buffers in each line which introduce the delay and a comparator. To be able to measure a range of delay from 400 psec up to 1.55 nsec 23 delay line stages have to be used. Additionally an initial delay of 400 psec exists before the delay line chains in order to save stages. This is feasible due to the fact that no delay lower than 400 psec has to be measured. The measurement results given in a thermometer code of a length of 23 bits is analyzed and transformed into a five-bit value.

Figure 26:
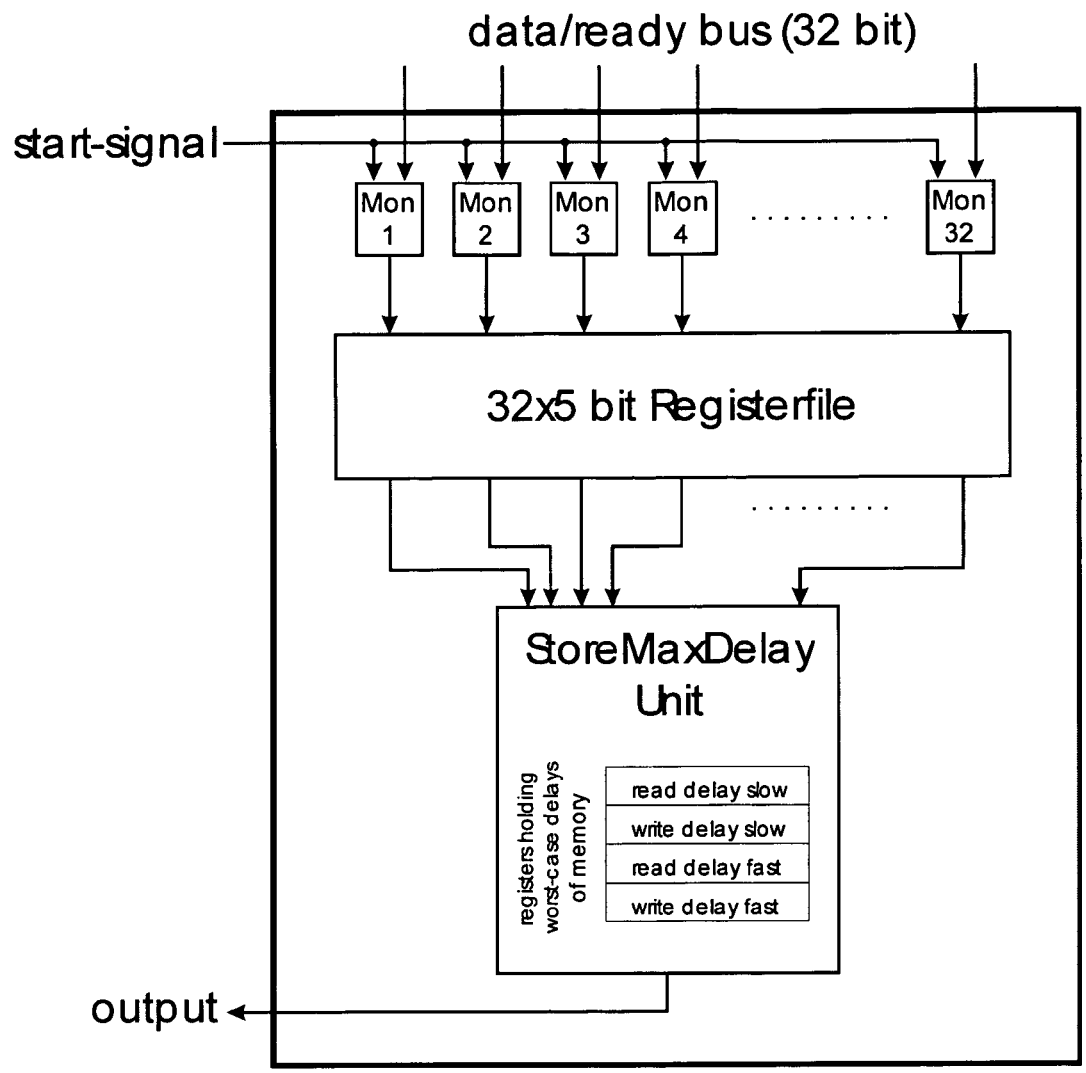
FIG. 26 illustrates the components of a complete delay monitor.

Since the delay monitor can only measure the delay difference between two one-bit signals and the goal is to measure the output of memories with a maximum bitwidth of 32, the complete delay monitor of the architecture consist of 32 such one-bit monitors and 32 registers of five bits each, as illustrated in FIG. 26. As described above, the 32 monitors asynchronously measure the delay of the different memory output bits and store them in a register. To calculate the worst-case delay of a single bitline all the measurement results of one bitline are written into a 32 times 5 bit registerfile. A unit, called the StoreMaxDelay, is provided for storing worst-case delays. The StoreMaxDelay-Unit is comparing in parallel the contents of the 5 bit registerfile and the worst-case delay is stored in a register. To find the worst-case of all the wordlines this register where the worst case delay is stored is only updated when another bitline delay is bigger than the stored worst-case delay. The number of registers where the worst-case delays are stored is equal to the pre-determined number mentioned above, e.g. four when the maximum read and write delay for the slow and fast configuration-knob are measured. Similar to the energy monitor the four maximum delay values stored in these registers are sent to the PVC after the complete measurement of one memory.

Process-Variation-Controller

The PVC is responsible for the control of the measurement and calibration and configuration-knob selection of the memory architecture. It is implemented as a Finite State Machine for the measurement and calibration phase.

The PVC can calibrate the memories to a given cycle-time constraint or to a given time-frame constraint. This functionality leads to two different implementations of the PVC which are discussed next.

1. Clock-Cycle-Level Adaptation

This version of the controller measures only the delay per access of the memories, since only delay adaptation can be achieved using this technique. The PVC is based on a system that has a fixed clock frequency in normal operation phase. So the memories of the system have to meet a fixed cycle-time constraint. This constraint is defined at design-time of the architecture and stored into a register which is known by the PVC.

Figure 27:
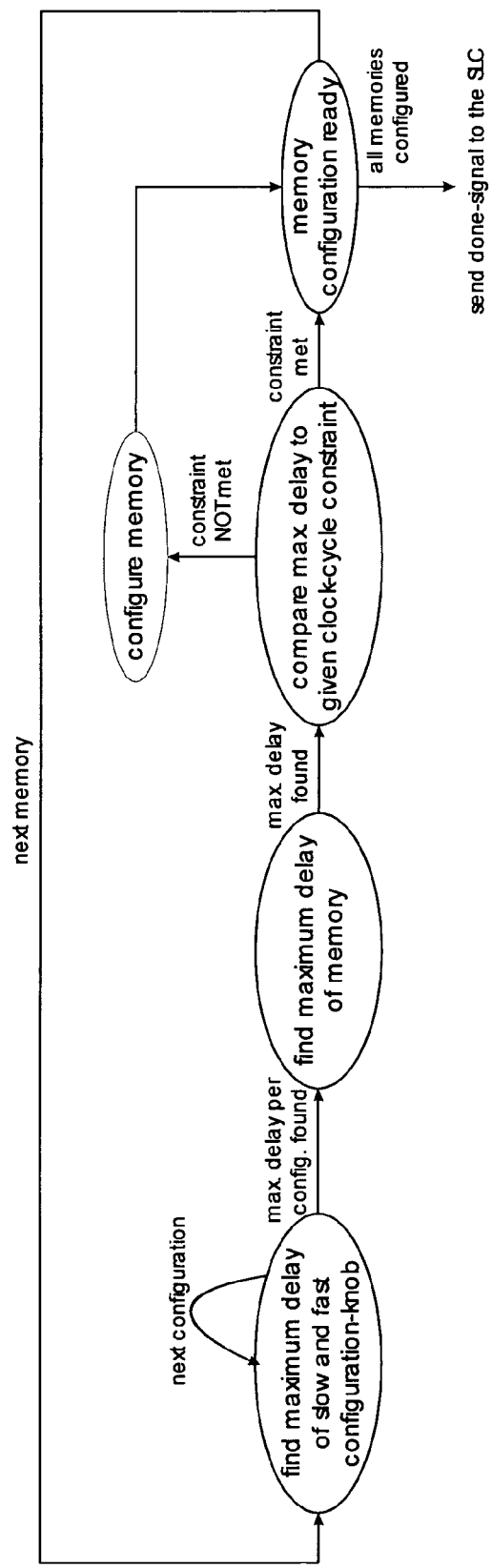
FIG. 27 illustrates the states of calibration for clock-cycle-level adaptation.

The PVC measures the maximum delay values for each configuration of the memory architecture (slow read; fast read; slow write; fast write) and stores them into a register file. In the calibration phase based on FIG. 27 the maximum delay of a memory per configuration-knob is calculated. To make sure that the slow configuration-knob of the memory is really slower than the fast one also these two maximum delays which were calculated before are compared. This problem could occur if the memory clouds overlap. The maximum delay of each memory is then compared to the cycle-time constraint. If the memory can meet the constraint with its less energy consuming slow configuration-knob there is no need to adapt. In case the memory cannot meet the constraint with this configuration-knob it has to be configured with the fast configuration-knob. After the configuration for all memories of the system is applied the PVC sends the done-signal to the system level controller (SLC) in order to proceed with the normal operation phase. During the normal operation phase the PVC is inactive.

2. Time-Frame-Level Adaptation

The time-frame-level implementation of the PVC additionally needs the energy consumption per access of each memory in the architecture. So the controller holds information about the maximum delays and energy consumptions per access of the complete memory architecture. Based on this information it is able to decide how the memories need to be configured in order to meet a given real-time constraint for executing the target application on the chip. This real-time constraint is obtained at design-time and stored into a register. Furthermore the PVC needs information about the number of cycles each functional unit uses within one time-frame. So this PVC can only be used for frame-based applications in which the functional units are executed sequentially. For the application of the DAB receiver this time-frame is one single audio-frame.

For the experimental setup with the DAB receiver the PVC splits the normal operation phase where the functional units are executed into three more phases (see FIG. 28): execution of the FFT, the Deinterleaver and the Viterbi. At the beginning of each of these phases, the clock of the system can be adjusted, more particularly its frequency can be adjusted. Due to the fact that the different functional units FFT, Deinterleaver and Viterbi are communicating between each other through interface memories (see FIG. 25) also the configuration-knob of these memories has to be adjustable at the boundary of each phase or functional unit. These three phases together with the adjustable clock-frequency of the system provide more possibilities to save energy compared to the clock-cycle-level adaptation.

The execution of the Viterbi is the most energy consuming and slowest phase in normal operation. It might be necessary that the clock of the system has to be slowed-down to make sure that all memories accessed during the Viterbi can be accessed within one clock-cycle in their slow and less energy consuming configuration-knob. In order to meet the time-frame constraint the memories of one or both of the other two phases might have to use the fast and more energy consuming configuration-knob. So with this configuration the PVC can allow the lowest possible energy consumption for executing one audio-frame of the DAB receiver and it still makes sure that the time-frame constraint can be met. Of course with the assumption that the system is properly designed.

Figure 29:
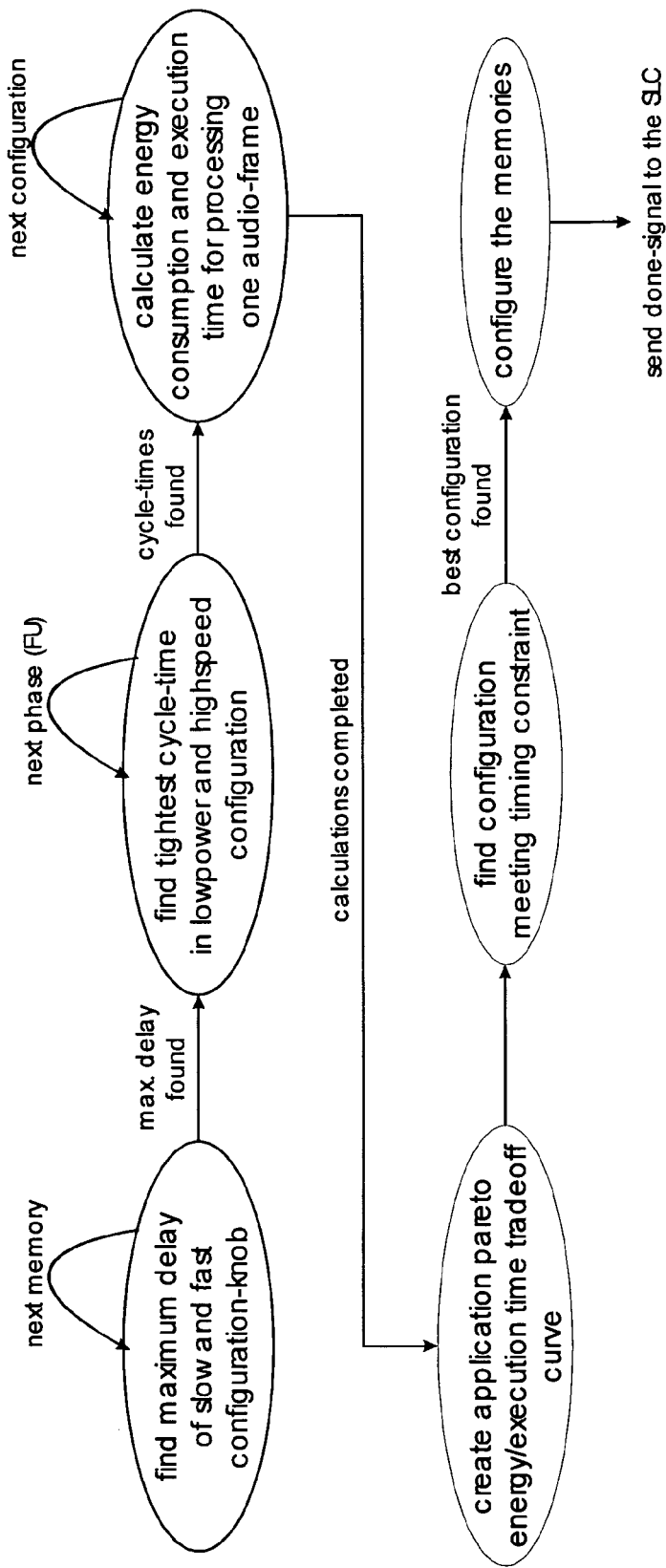
FIG. 29 illustrates the states of calibration for the time-frame-level adaptation

The first step the PVC does after the start-up of the system is again a measurement phase. After the information about delay and energy consumption of each of the memories is available, the PVC is able to enter the calibration phase. In this phase, as shown in FIG. 29, the maximum delay of each memory for its slow and fast configuration-knob is calculated. Based on these maximum memory delays and the mapping of the memories to the functional units FFT, Deinterleaver and Viterbi (FIG. 25), the tightest cycle-time for low-power and high-speed configuration of each functional unit can be obtained. To reduce the overhead in terms of area and energy consumption of the PVC, the memories of one of these three phases can only be switched to the same configuration knob. Theoretically the optimal energy configuration can be gained by switching the memories independently to allow memories which are fast enough to stay in the slow configuration-knob. So with the implemented PVC eight possible configurations are possible as shown in table 1 hereinbelow.

TABLE 1

The eight possible configurations with three phases in normal operation phase.
Configuration

Figure 28:
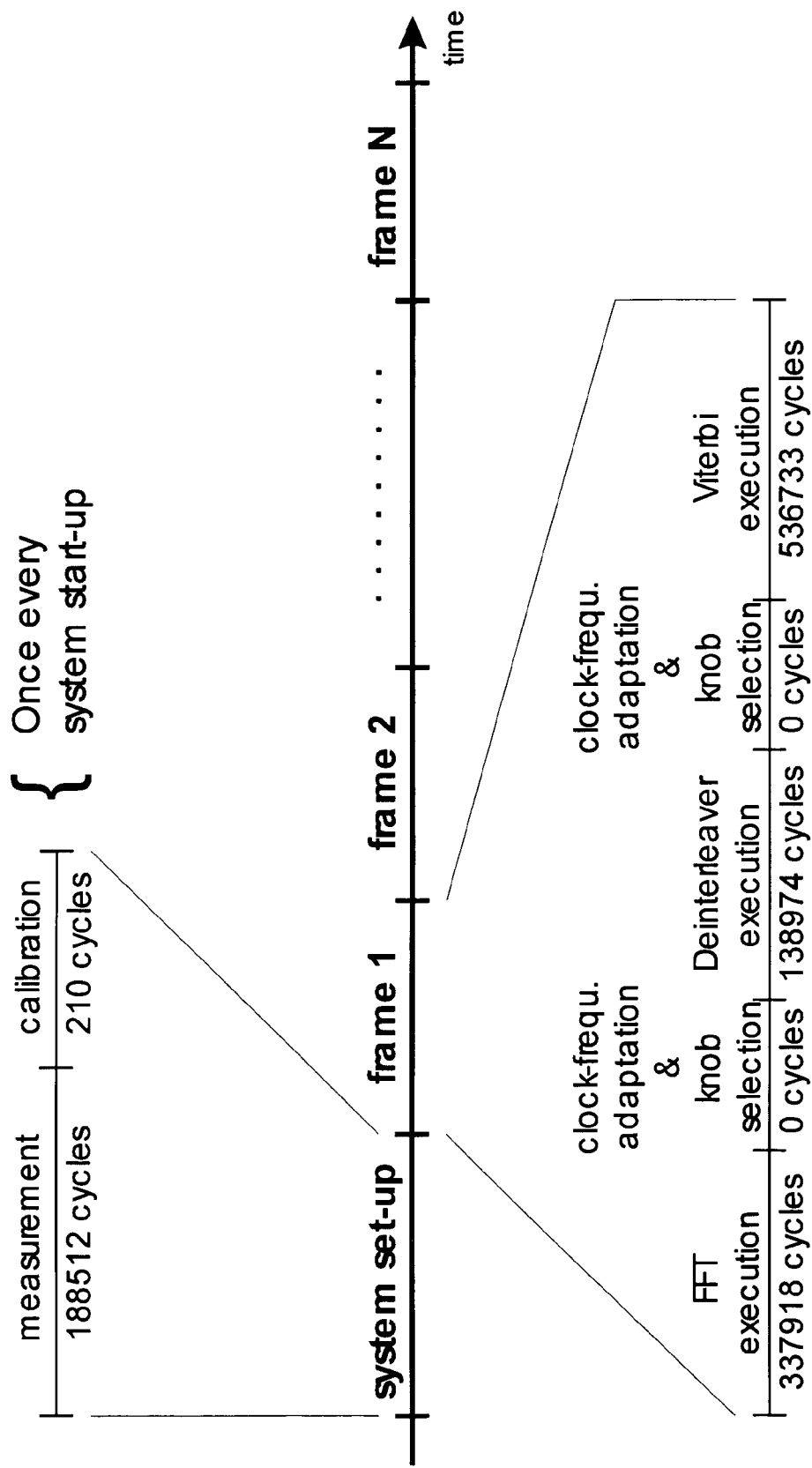
FIG. 28 illustrates the phases of time-frame-level adaptation.

| FFT | Deinterleaver | Viterbi |
|---|---|---|
| low-power | low-power | low-power |
| low-power | high-speed | low-power |
| high-speed | low-power | low-power |
| high-speed | high-speed | low-power |
| low-power | low-power | high-speed |
| low-power | high-speed | high-speed |
| high-speed | low-power | high-speed |
| high-speed | high-speed | high-speed | low-power: all memories of this phase are configured to slow
high-speed: all memories of this phase are configured to fast For these eight possible configurations the energy consumption and the execution time for processing one audio-frame of the DAB receiver is calculated based on the measured information about the memory architecture. For the calculation of the energy the access frequencies of the memories are needed. They are available in registers. So, as can be seen in FIG. 29, in the next step the energy consumption and the execution time for each configuration are calculated. The results for each configuration are stored into a register file. With all the calculated information a trade-off cost/performance curve, e.g. a Pareto energy/execution time trade-off curve, can be obtained. Based on this trade-off curve the closest configuration to the time-frame constraint which has the lowest energy consumption is chosen. In the next step this configuration is applied to the memory architecture via the memory configuration-knobs. Also the switches of the configuration-knobs of the memories and the clock-frequency adaptation at the boundaries of the three phases during the execution of an audio-frame are decided in this step. Therefore, as FIG. 28 shows, it is possible to perform the configuration-knob switch and the adaptation of the clock-frequency without stopping the execution of the functional units.

3. System-Level-Controller

This controller is responsible for the execution of the different phases at the right time. So the SLC is implemented as a Finite State Machine that defines which phase is going to be executed. After the start-up of the system the SLC starts the measurement phase of the PVC. After the PVC has finished with the measurement phase a done signal is received by the SLC. So the SLC knows that measurement is done and starts the calibration phase of the PVC. After completing the calibration again a done signal is received and the SLC starts the normal operation phase in which it acts as the memory management unit of the functional units and provides the network controller with the right source and destination block-addresses. This memory management functionality within the SLC is also implemented as a Finite State Machine. For synchronization purposes the SLC also transmits and receives start and stop signals to and from the functional units. This is necessary because the SLC has to tell the PVC and the PLL at the boundary of each of the three phases in normal operation phase to switch the memory configuration-knobs and to adjust the clock frequency. When the cycle-accurate behavior is exactly known the SLC can be replaced by an instruction-memory-hierarchy and the signals which are needed for synchronization issues can be removed.

4. Memory

To maximize parametric yield at the system level it is required to add run-time configuration capabilities to the memory. A controller will configure the memories at run-time to a setting which meets the cycle time constraints in case the real-time execution constraints are violated after fabrication.

The memories of the architecture are implemented with a completely asynchronous interface. To inject process variability, a package with timing information, e.g. generated by a C-program, is involved in the VHDL description of the memory. Using the following terminology the memory is provided with different delays for each bitline.

for i in data_width-1 down to 0 loop
  ready(i)<=transport '1' after rd_delay_fast(cdata_width_max-1-i); end loop;

In order to get a completely asynchronous interface which is also taking into account the additional network delay, the memory has a process which is listening to the address and data port. When the chip select signal of the memory is activated and when the address in read mode or when the address and the data in write mode of the memory are stable, the process starts adding the delay of the memory due to process variation as described above. The process is creating an internal signal, and when this signal is stable too, the data is written into the memory or transferred to the output port depending on whether the memory is currently read or written. In write mode the memory also drives another output called ready port. This port is necessary to measure the write delay of a memory as discussed above.

5. Communication Network

The three different address, data and ready buses shown in FIG. 25 are implemented in the communication network based on segmented buses. The memory organizations of low-power systems are typically distributed so a centralized switch implementation would be a bad design choice. This communication network provides a bandwidth of three parallel transfers per cycle. The buses are bidirectional shared connections among a number of blocks and the long wires are split into segments using switches.

The SLC and the PVC have to supply a source and a destination block-address and the number of transactions which are performed in parallel. The PVC has to do this in the measurement phase when it is applying test vectors to the memories and reading the measured values from the monitors. The SLC takes care of applying the right block-addresses in normal operation phase instead of the memory management unit of the functional units as mentioned in the section about the system level controller. A small network controller with a look-up table controls the configurations of these switches. Based on the source and destination block-address of the current communication the controller finds the correct entry in the table and applies it to the switches.

6. Phase-Locked-Loop

The task of the phase-locked-loop (PLL) is the adaptation of the system clock. As discussed in previous sections the clock frequency is adapted at the boundaries between the functional units in normal operation phase. For measurement the clock is relaxed to a clock-cycle of 3 nsec to make sure to have stable results from the one-bit monitors (see above).

Due to the complexity of the PLL in first instance only a frequency divider may be implemented. This frequency divider is able to adjust the frequency of the system to a given value. This value is applied by the SLC for all different phases. In normal operation phase the SLC receives this values from the PVC. The clock-cycle values for measurement and calibration phase are fixed and stored in registers. The value itself is given in the same format as the delay of the memories and represents the time for one single clock-cycle. So the value of the clock can be calculated using formula:

$$PLL\_clock\_value = cycle\_time[ps]/50\ ps–400\ ps$$

Methodology

The approach of the present invention includes a minimal compile-time and a synthesis-time phase to accomplish run-time compensation of the impact of process variability and energy consumption minimization. At compile-time, the mapping of the application data into the available memories has been determined, and the timing constraint to achieve real-time operation of the system has been calculated. Based on this information also the number of cycles for the various parts of the application can be extracted as well as the number of memory accesses of each of these parts. The impact of variability is neglected in this stage. At synthesis-time, the architecture which includes a controller and run-time configurable memories is developed. This architecture is able to adjust itself to meet the application deadlines, by adjusting the memory configurations and the clock frequency to meet the application timing constraints. This approach is scalable to future technology nodes, because it relies on circuit design techniques for the compensation and not on technology parameters which are becoming more limiting with each new technology node. Compared to existing application specific design implementation flows the only addition is a level of control above the normal data-path controllers. Also, the normal memories are substituted by configurable ones.

Hereinafter, the basic principles of the technique according to embodiments of the present invention are set out. The fundamental compensation technique is introduced first. Then two ways of using this technique are proposed, one for delay compensation at the clock cycle level and one for delay compensation at the application level.

An assumption made throughout the explanation hereinafter is that the target application is periodic in nature and that it is executed sequentially. This means that different regions of the application are not pipelined. This is the typical case for any frame-based multimedia application executed as a single thread of control. This assumption can be overcome, it is not a fundamental road-block for this technique.

Compensation Technique

This section illustrates in a simple example how the technique according to the present invention can be applied and why it can provide robustness against process variability.

Figure 30:
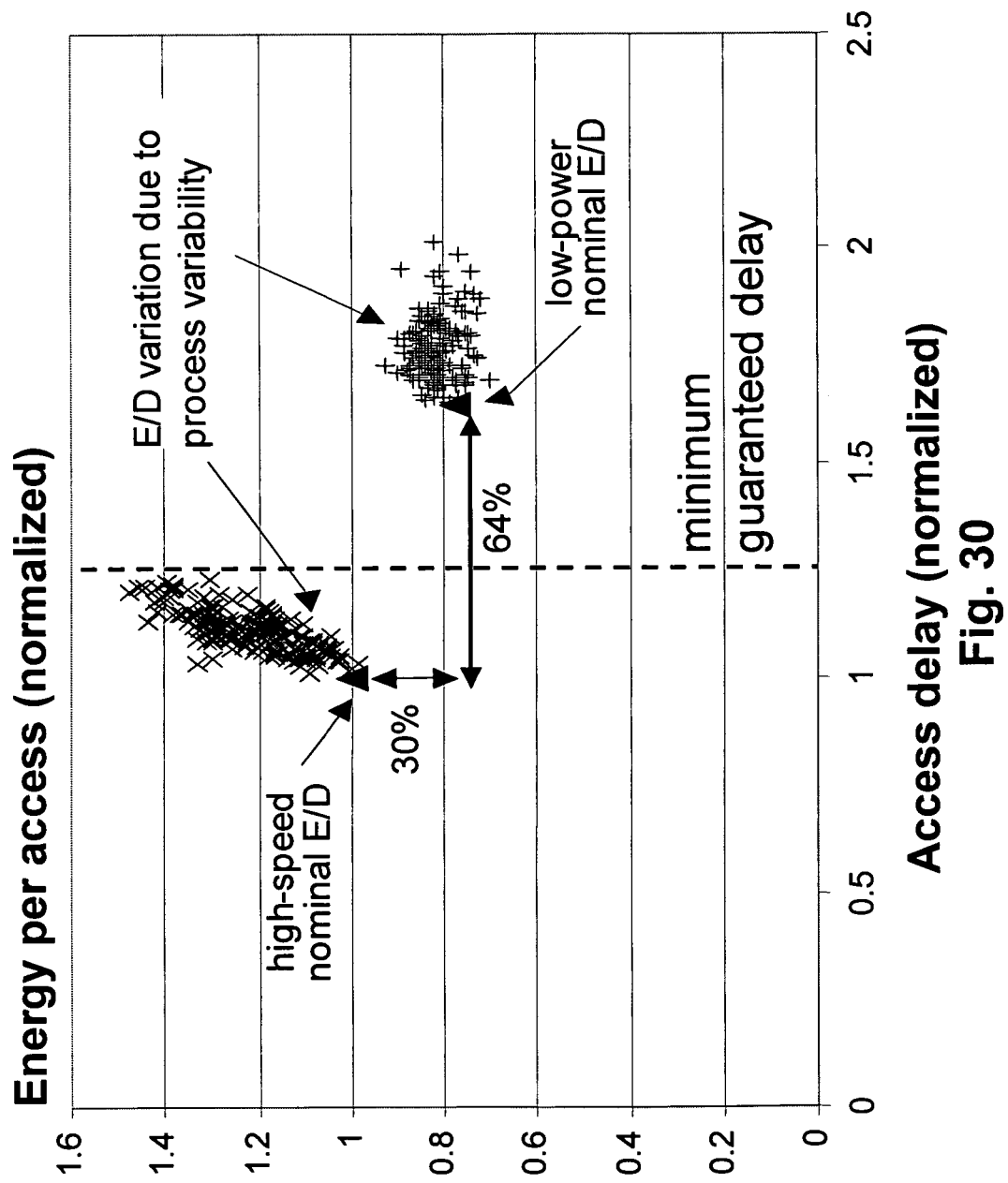
FIG. 30 illustrates a configurable memory that offers two possible configurations, a slow low-energy one and a fast high-energy one. Its configuration can change at run-time, but not on an individual cycle basis. The results come from a transistor-level simulation of a 1 Byte memory with reconfigurable decoder and word line drivers.

It is assumed that the memories available on the platform offer run-time reconfigurability, as illustrated in FIG. 30, showing transistor level simulations at 65 nm, e.g. a low-power option and a high-speed option which can be switched at run-time. Process variability severely impacts the cost/performance, e.g. energy/delay behaviour of the memories. After fabrication, the actual energy/delay performance is a point in each cloud. One important property of these clouds is that they should not overlap in the delay axis. If this is satisfied then the actual high-speed memory performance is always faster than the actual low-power performance irrespective of the impact of variability on delay. This property is exploited by the run-time controller to guarantee parametric yield.

Figure 31:
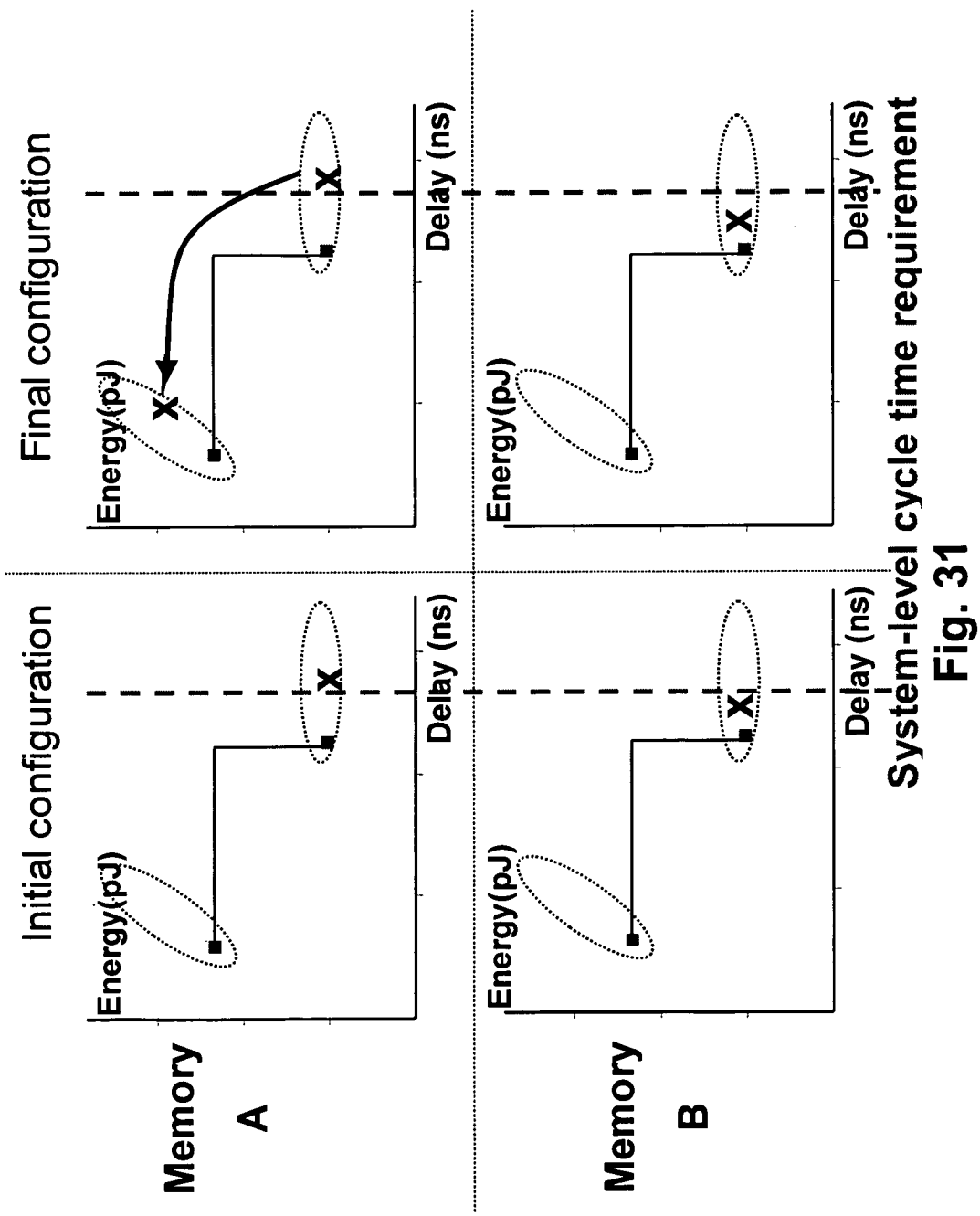
FIG. 31 shows two equal-size memories on the same chip. Due to variability their access delays are different. The one that violates the cycle time requirement should be switched to its fast configuration.

FIG. 31 illustrates how the controller adapts the memory configurations to guarantee parametric yield. The energy/delay characteristics of two identical memories are shown. Their nominal behavior is the same, but after fabrication their actual performance differs due to process variability. Given the cycle time constraint shown, memory A has to be switched to its high-speed and high energy consumption configuration to meet the global timing constraints, while memory B does not. Since the two clouds for the two configuration options of memory A do not overlap in the delay axis, it is guaranteed that this configuration will meet the timing constraints. Thus parametric yield is guaranteed, as long as the application cycle time constraints do not become lower than the minimum guaranteed delay of the slowest memory.

To achieve such run-time compensation the technique according to the present invention includes a compile-time and a synthesis-time phase. During compile-time the characteristics of the application are extracted, for example the number of cycles per functionality needed for decoding one audio frame, the mapping of application data to memories and the subsequent number of accesses per memory.

The next sections introduce the two different ways of using this basic principle. A first way exploits the number of configurable memories in the memory organization to create application-level energy vs. execution time trade-offs. A second way exploits the application characteristics, thus can be applied even to centralized memory organizations without hierarchy. But for both of these approaches, the fundamental enabling characteristic is the reconfigurability of the memories. The larger the energy and delay range at the memory level, the larger the energy and execution time ranges will be at the application level.

Clock Cycle Level Adaptation

The simplest way to use the fore-mentioned technique is to determine an optimal cycle time for the application and to let the memory organization adapt to this constraint. The computation of this constraint is straightforward after the application mapping (or RTL description) step, the real-time constraint for the execution time of the application divided by the number of cycles required to run the application yields the target cycle time. However, this cycle time should not be smaller than the minimum guaranteed delay that the platform can offer, see FIG. 30.

Figure 32:
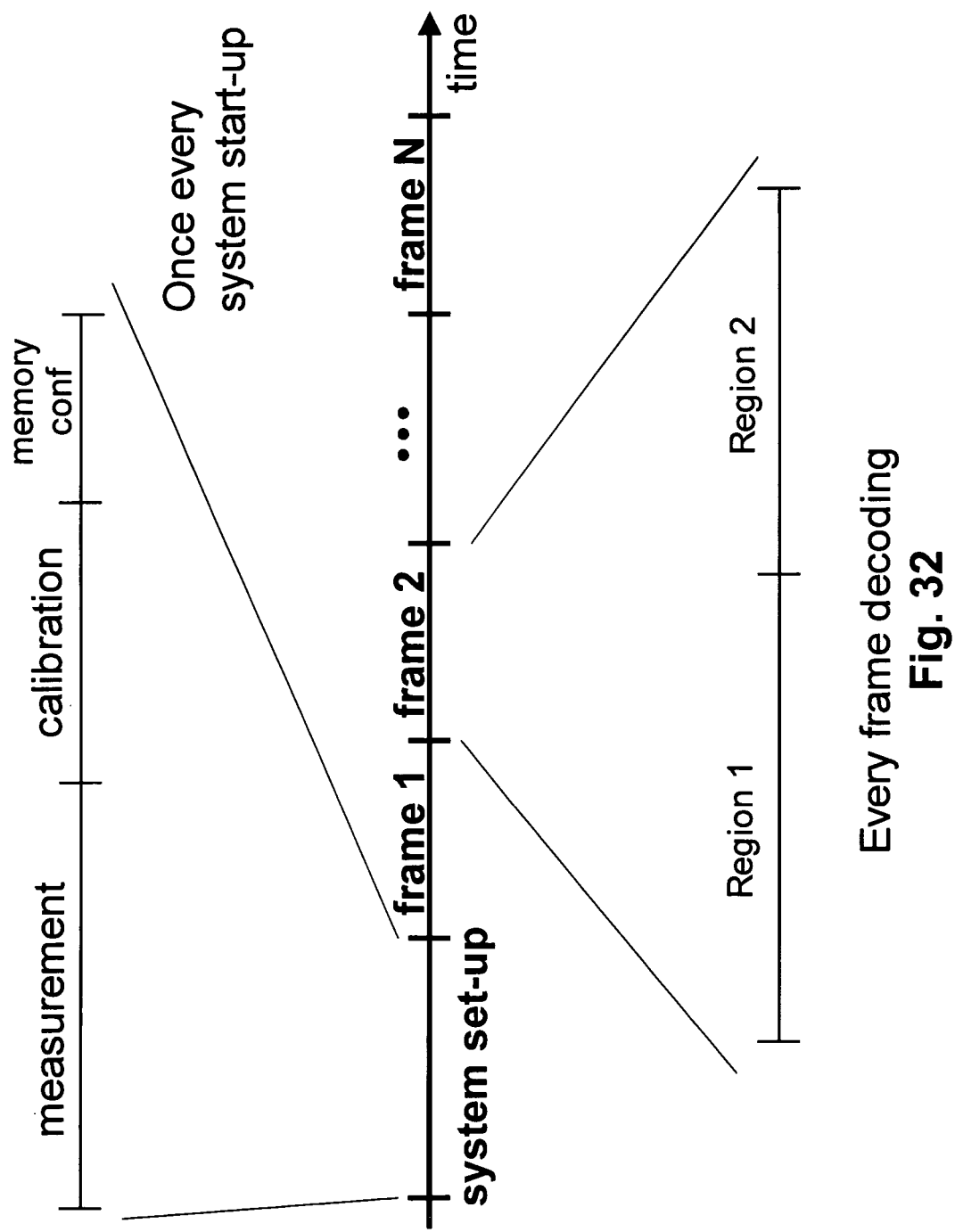
FIG. 32 illustrates the scheduling of the measurement, calibration, memory configuration and normal operation. The memories are configured only once in the simple case. Configuration of the memories at the beginning of each frame is also possible, but this is also a bit more costly.

Once the target clock cycle time is calculated, the memories in the organization are adapted based on the basic principle described in the previous section. As shown in FIG. 32, the measurement, calibration and memory configuration steps are only executed once at the start-up of the system and then the application is run without any modifications.

The technique described can only compensate for the impact of variability which does not vary temporally; it cannot compensate for the impact of the varying temperature on the performance of the memory organization.

The number of different configurations that this technique offers is limited to the number of memories in the memory organization. If it is assumed that only two nominally identical memories exist and no process variability, then their performance would be identical. So if one memory would not be fast enough and had to be switched, the second one would also need to be switched. The actual impact of variability makes the performance of the memories heterogeneous, thus offering more alternative system-level configurations. But, their number is still limited by the number of memories in the organization.

One of the main advantages of this technique is the extremely limited compile-time effort that is required. The only information needed is the number of cycles for executing the application, which is always defined in any implementation design flow. The target clock frequency is calculated from the real-time constraint of the application. At run-time the only required functionality is a comparison between the actual memory performance and the target clock frequency and potentially adjusting the memory configuration.

A simple extension can allow this technique to compensate for the impact of process variability at a finer granularity, namely at the beginning of each frame. The measurement phase and the calibration phase can still be done only once at the start-up of the system. If the memory configuration step, however, is done at the beginning of each frame then also the impact of temperature and other temporally varying effects can be compensated.

Application Level Adaptation

A more complex way of compensating delay is to distribute the available execution time between the various application functionalities in such a way that the cycle time is not constant throughout the execution of the application. If it is assumed that the different functionalities of the application are performed in a serial way (one after the other as opposed to a parallel way as in a pipeline), then the clock cycle needs to change in a temporal way. For a few milliseconds it will be 10 ns and then for another few milliseconds it can change to 20 ns, for instance. If the functionalities are pipelined, thus executed in parallel, the cycle time needs to change in a temporal and in a spatial manner. This introduces side-effects in case memories exist that are used by more than one application functionality. For now the method will be restricted to applications that can be described by a single CDFG (Control & Data Flow Graph), thus applications that comprise a single thread of control. They can include instruction-level parallelism and data-level parallelism. Furthermore, it will be assumed for now that there is dealt with applications that are periodic in nature, like audio decoding, frame-based video decoding, etc. Although, these are not hard constraints for the technique according to the present invention, they make the implementation much less costly. Extensions to handle more generic applications are rather straightforward for a person skilled in the art, since the compensation principle remains the same.

Figure 33:
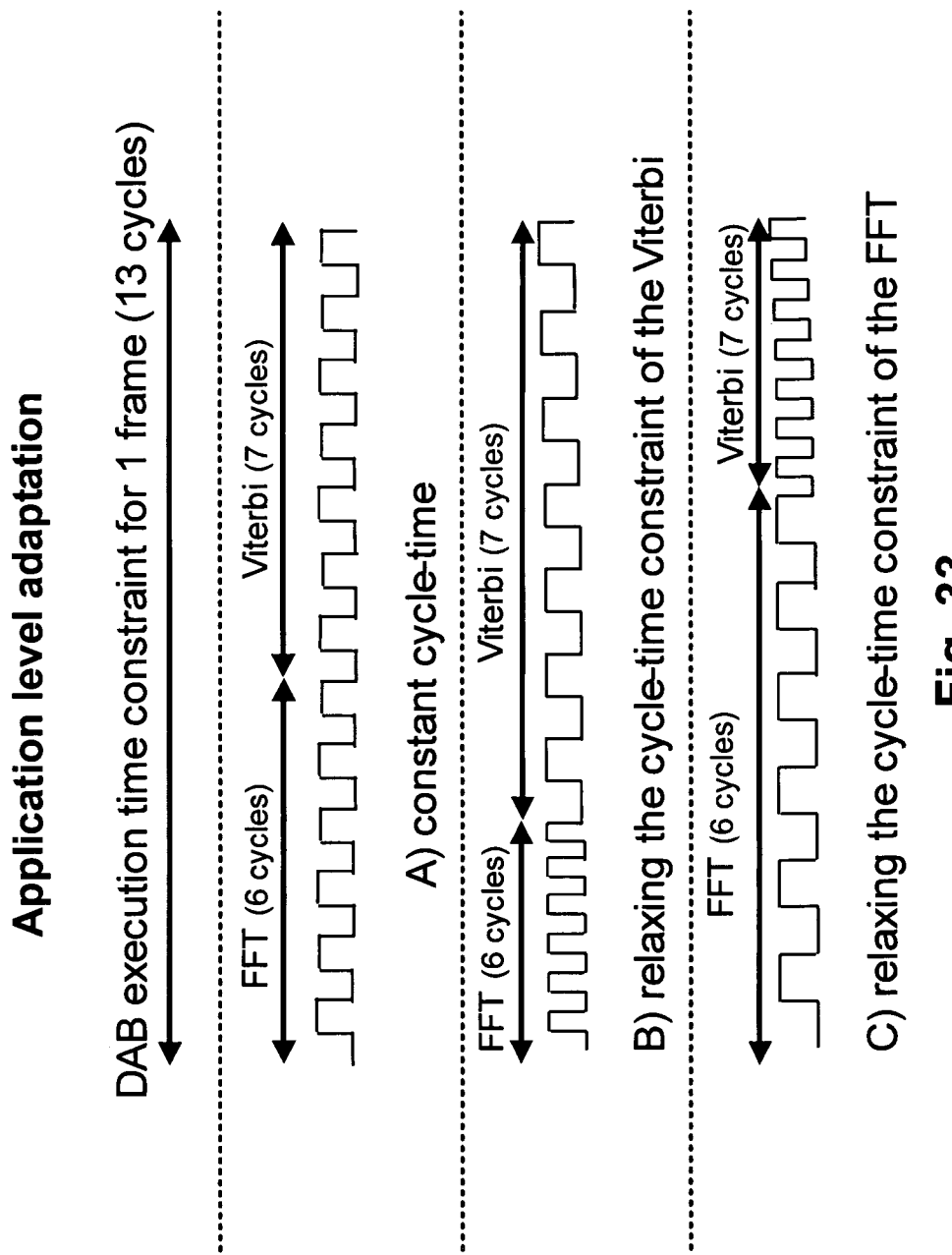
FIG. 33 illustrates three possible options for distributing the available execution time between two different functionalities or "parts" of the application.

FIG. 33 shows how the available execution time can be distributed among the various functionalities. In the case illustrated a simple application is assumed which first performs an FFT operation on some input and then performs a Viterbi operation. These two operations are executed one after the other. In order to achieve delay compensation of process variability impact and energy consumption minimization, the available execution time has to be distributed between the two functionalities in an optimal manner.

It is assumed, as an example only, that the FFT functionality performs a first number of memory accesses per cycle, e.g. one, and that the Viterbi functionality performs a second number of parallel memory accesses per cycle, e.g. three. As illustrated in FIG. 33 the FFT needs a first number of cycles to execute, e.g. 6, and the Viterbi needs a second number of cycles, e.g. seven; this can be easily generalized. Furthermore it will be assumed that if the execution time is distributed evenly between the total of the first and the second number of cycles, in the example given between 13 cycles of the application, the memories need to be configured to the high-speed option. If, however, the cycle-time is relaxed, the memories can be configured to their low-energy option. This means that in the time distribution shown on top in FIG. 33 the memories need to be always configured at high-speed; in the middle case they are in the high-speed mode for the FFT and in low-energy for the viterbi and vice versa for the bottom distribution.

If the memory energy consumption $E_{memory}$ of each high-speed memory access is $E_{hi}=1.5$ energy units and of each low-energy memory access is $E_{lo}=1$ energy units, the total energy consumption of the memory organization of the system can be calculated in the following way:

$$E_{total}=NPA_{Viterbi} \cdot NC_{Viterbi} \cdot E_{memory} \cdot NPA_{FFT} \cdot NC_{FFT} \cdot E_{memory},$$

where $NPA_x$ stands for number of parallel accesses for functionality X and $NC_x$ stands for number of cycles for functionality X.

The energy consumption of the three different options of FIG. 33 can now be calculated. In case A (constant cycle-time), the total memory energy consumption is $E_{total}=3\cdot7\cdot E_{hi}+1\cdot6\cdot E_{hi}=40.5$ units. In case B (relaxing the cycle-time constraint of the Viterbi), a similar calculation yields $E_{total}=30$ units and for case C (relaxing the cycle-time constraint of the FFT), the result is $E_{total}=37.5$ units. Clearly case B is the optimal solution for energy, while meeting the global application timing constraint.

The above calculations, however, cannot be done completely at compile- or synthesis-time. Some parameters are fully determined by the application mapping at compile-time, like the number of cycles and memory accesses. The energy per access and the delay of the memories, on the other hand, can only be measured after fabrication. Compile-time estimations are not possible given the very large impact of variability of the memory behaviour.

This means that these calculations and, thus, the system adaptation needs to be done at run-time. In case the impact of variability does not change in time, doing them once per system start-up or even once after fabrication during testing is enough. If the variability impact changes significantly over time then the calculations need to be performed on a periodic basis.

This method of compensating at the application level exploits the characteristics of the application. The number of available operating points is only dependent on the application and can be very high, because any realistic application can be split into many functionalities. Thus the granularity of the results depends only on the application and even if the memory organization consists of a single memory, still a reasonable energy consumption—execution time range can be obtained for the entire application. However, introducing more operating points requires a more intensive calculation of the optimal operating points at the measurement and calibration phases. And even though, the execution time for these calculations is not an issue, since they are done only once, the complexity of the hardware blocks that performs them and its area may become significant.

Figure 34:
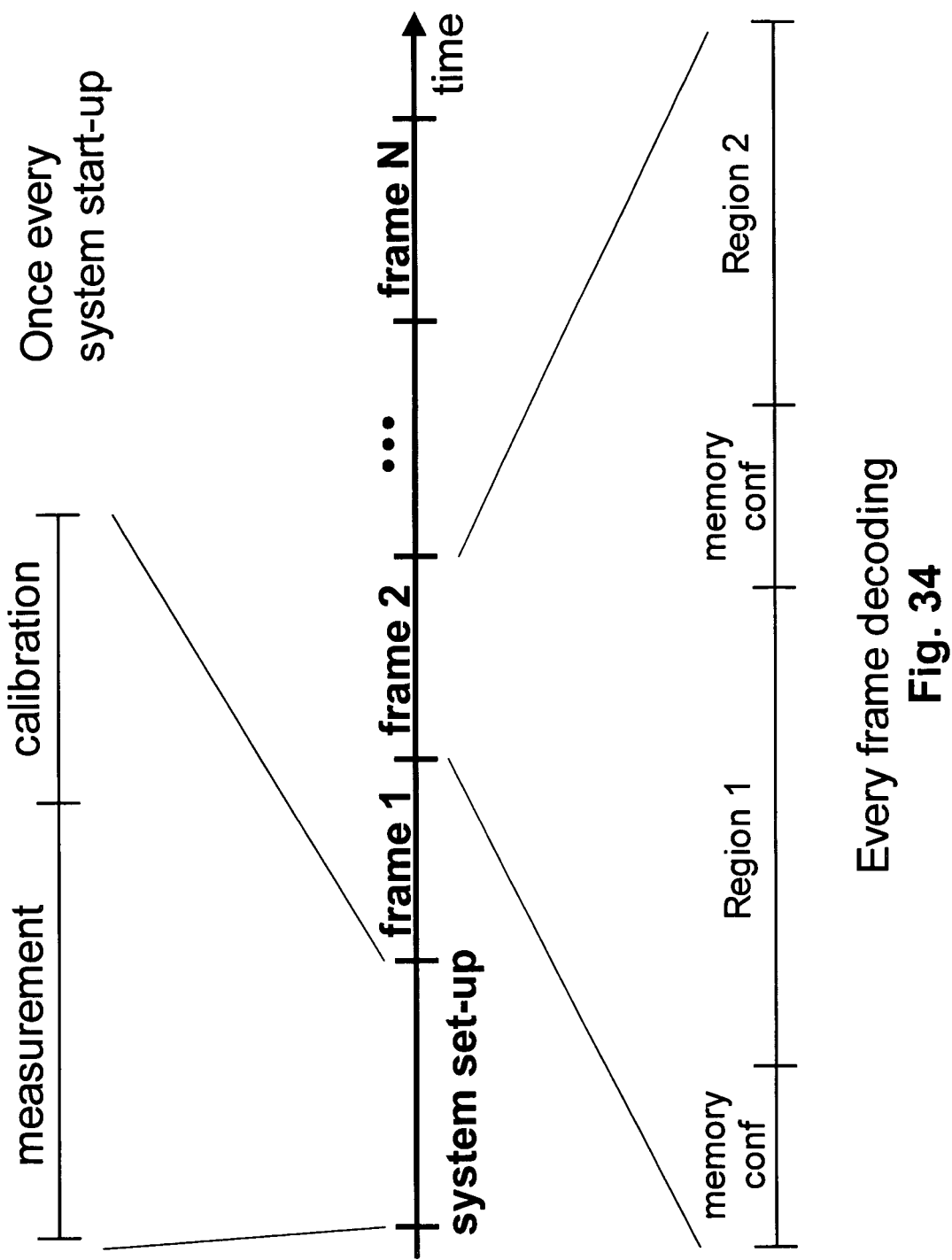
FIG. 34 illustrates that the memories need to be configured between the various functionalities of the application, since the target clock frequency varies throughout the application execution.

The effect of this technique on the global system-level scheduling of operations is that the memory configuration step has to be executed in between the execution of the various application functionalities, as illustrated in FIG. 34.

Application: Digital Audio Broadcast Receiver

Figure 35:
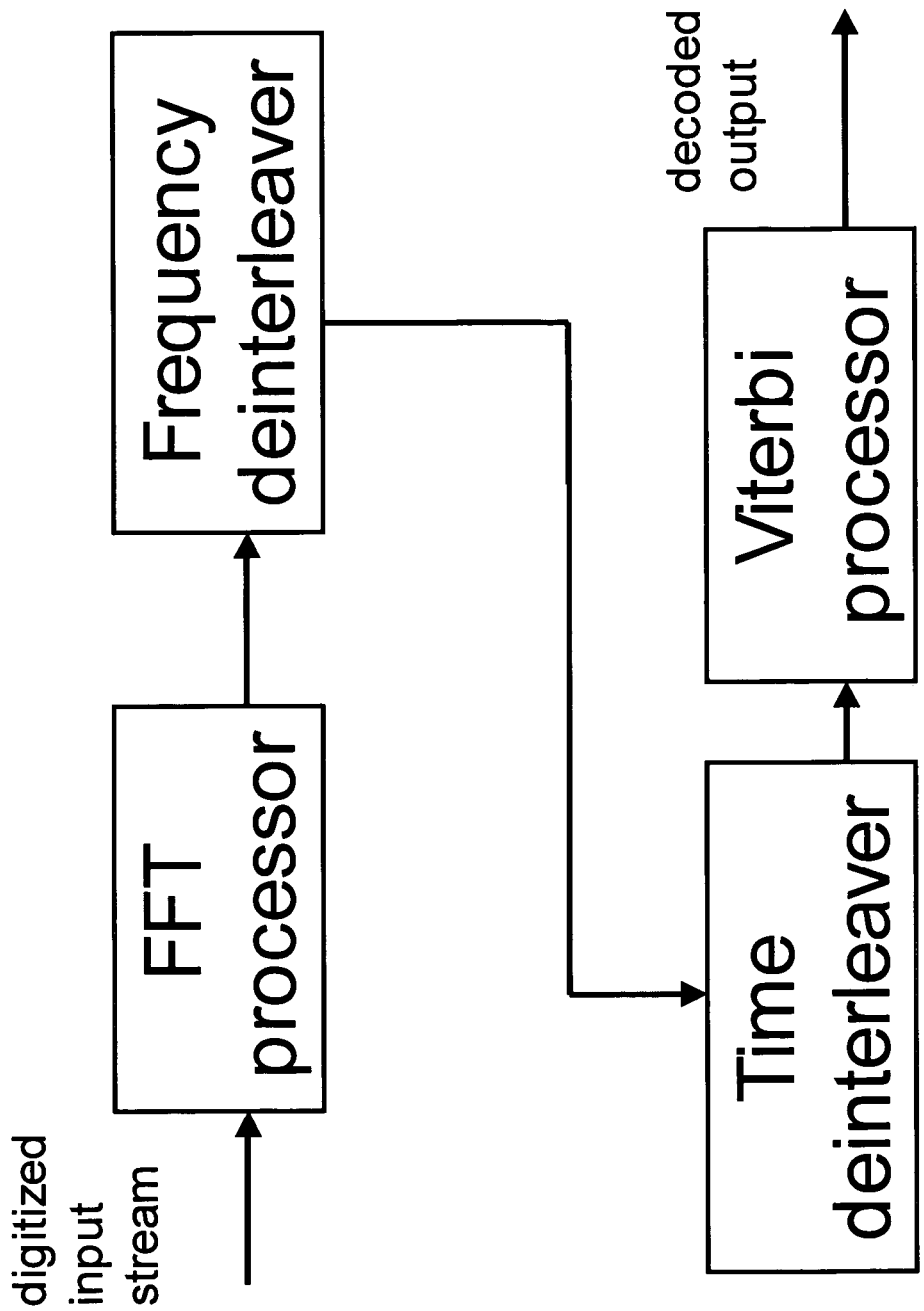
FIG. 35 shows a block diagram of a Digital Audio Broadcast receiver.

The described technique will be described referring to an application specific design implementing a Digital Audio Broadcast (DAB) receiver, as illustrated in FIG. 35.

The transmission system in the DAB standard is based on an Orthogonal Frequency Division Multiplex (OFDM) transportation scheme using up to 1536 carriers (Mode I) for terrestrial broadcasting. At the DAB receiver side the OFDM carrier spectrum is reconstructed by doing a forward 2048-point FFT (Mode I) on the received OFDM symbol. This functionality is assigned to the FFT processor shown in FIG. 35.

Forward error correction and interleaving in the transmission system greatly improve the reliability of the transmitted information by carefully adding redundant information that is used by the receiver to correct errors that occur in the transmission path. The frequency and time de-interleaver blocks unscramble the input symbols and the Viterbi processor is the one performing the error detection and correction based on the redundant information.

The energy optimal mapping of the DAB application data results in a distributed data memory organization that consists of nine memories, seven of them having a capacity of 1 KByte, one of 2 KByte and the last one of 8 KByte. Their bitwidths are either 16 or 32 bits.

Four distinct functionalities are performed in the decoding of the input signal as shown in FIG. 35. During the hardware/software partitioning of the application it has been decided to have dedicated hardware for the implementation of the FFT and the Viterbi functionalities, while the frequency and time de-interleaving is performed on a processor. However, the Viterbi functionality is the most computing intensive, requiring more than half of the total execution time for decoding of a frame. Furthermore, it is assumed that the FFT and Viterbi are not pipelined, they operate on the same frame sequentially. As a result, it has been decided to keep the FFT and the de-interleavers running on the same clock frequency and the Viterbi will run on a different one. This way energy can be traded-off for a faster execution in any of these two groups of functionalities if process variability makes the system too slow.

Figure 36:
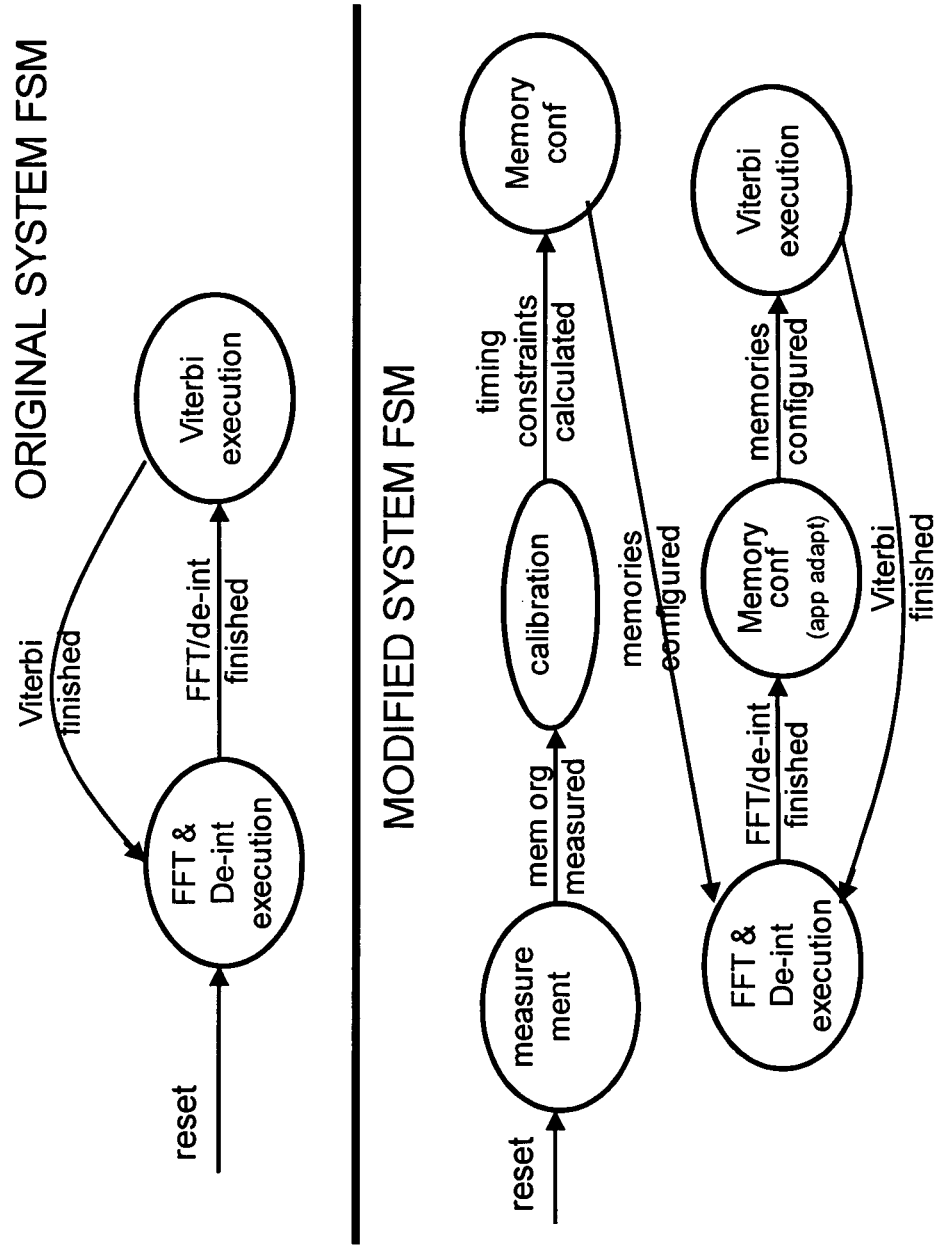
FIG. 36 shows on top an abstract view of the original Finite State Machine of the DAB design. The bottom part of FIG. 36 shows the additional states that are required to implement the necessary functionality for run-time compensation of process variability impact.

FIG. 36 shows a simplified original Finite State Machine for the execution of the DAB application without the process variability compensation technique (top) and the one including it (bottom). Additional states are needed to accommodate for the measurement and calibration phases which are executed seldom as well as the state where the memories are configured. As mentioned earlier, these additional states required for the compensation can be added without affecting the control of the application execution.

In the measurement state the delay and the energy consumption of each memory in the organization is measured and the information is communicated back to the controller. During calibration the controller calculates the optimal cycle times for execution of the FFT and de-interleavers and for the execution of the Viterbi, such that the real-time operation is guaranteed and global energy consumption is minimized. The knob selection phase is where the controller configures each memory to meet the required cycle time constraint. The architecture which can implement such an FSM is discussed hereinabove.

It is to be understood that although preferred embodiments, specific constructions and configurations have been discussed herein for devices according to the present invention, various changes or modifications in form and detail may be made without departing from the scope and spirit of this invention.

What is claimed is:

1. A method for generating an electronic system, comprising a run-time controller and an electronic circuit, wherein the run-time controller is configured to control the electronic circuit based on trade-off information, and actual performance of said electronic circuit differs from simulated performance of said electronic circuit, the method comprising:
generating a system-level description of the functionality and timing of said electronic circuit, wherein said system-level description is generated based on simulated performance of said electronic circuit and includes first trade-off information;
generating said run-time controller based on said system-level description; and
generating a process variation controller configured to generate second trade-off information by modifying said first trade-off information based on a performance measurement of said electronic circuit operating in an operational mode, wherein determining the second trade-off information comprises performing measurements on a manufactured actual electronic circuit, wherein during said performance measurement, said electronic circuit is controlled by said run-time controller using said first trade-off information,
wherein said run-time controller is further configured to select an operating point from a plurality of operating points based on said second trade-off information, wherein said selected operating point is selected to compensate for performance of said electronic circuit affected by process variations, and wherein said performance measurement measures at least timing information.

2. The method of claim 1, wherein second system level description is operable in various working modes, each of said working modes having a unique performance/cost characteristic, said performance/cost characteristics of said working modes defining a performance/cost trade-off relationship, said actual electronic circuit being capable of operating under said working modes.

3. The method according to claim 1, wherein the first trade-off information is Pareto information.

4. The method according to claim 1, wherein determining the second actual trade-off information comprises performing measurements on a manufactured actual electronic circuit.

5. The method according to claim 1, wherein the first trade-off information is trade-off information for software to run on a manufactured actual electronic circuit.

6. The method according to claim 1, wherein the first trade-off information is trade-off information of hardware in a manufactured actual electronic circuit.

7. The method according to claim 1, wherein the electronic circuit is a memory.

8. The method according to claim 1, wherein the second actual trade-off information is obtained by calibration of a manufactured actual electronic circuit with the first trade off information.

9. The method according to claim 1, wherein the run-time controller is implemented as any of an operating system, dedicated hardware or a combination of these.

10. The method according to claim 1, wherein modifying said first trade-off information comprises calibrating said first trade-off information to correct values.

11. The method according to claim 1, wherein said run-time controller is further configured to deactivate failing circuitry.

12. The method according to claim 1, wherein the second trade-off information comprises a plurality of operating points.

13. A machine-readable program storage device comprising instructions for execution on a processing engine, the instructions defining a run-time controller for an electronic system, said electronic system comprising a run-time controller and an electronic circuit, wherein the instructions cause the processing engine to perform a method, the method comprising:
generating a system-level description of the functionality and timing of said electronic circuit, wherein said system-level description is generated based on simulated performance of said electronic circuit and includes first trade-off information;
generating said run-time controller based on said system-level description; and generating a process variation controller configured to generate second trade-off information by modifying said first trade-off information based on a performance measurement of said electronic circuit, operating in an operational mode, wherein determining the second trade-off information comprises performing measurements on a manufactured actual electronic circuit, wherein during said performance measurement, said electronic circuit is controlled by said run-time controller using said first trade-off information, wherein said run-time controller is further configured to select an operating point from a plurality of operating points based on said second trade-off information, wherein said selected operating point is selected to compensate for performance of said electronic circuit affected by process variations, and wherein said performance measurement measures at least timing information.

14. The method according to claim 13, wherein the second trade-off information comprises a plurality of operating points.

* * * * *

UNITED STATES PATENT AND TRADEMARK OFFICE
CERTIFICATE OF CORRECTION

| | |
|---|---|
| PATENT NO. | : 8,578,319 B2 |
| APPLICATION NO. | : 11/095494 |
| DATED | : November 5, 2013 |
| INVENTOR(S) | : Papanikolaou et al. |

It is certified that error appears in the above-identified patent and that said Letters Patent is hereby corrected as shown below:

On the Title Page, References Cited

Column 1 (page 2, item 56) at line 30, Under Other Publications, Change "certainity" to --certainty--.

Column 1 (page 2, item 56) at line 30, Under Other Publications, Change "Uncertainity" to --Uncertainty--.

In the Specification

Column 3 at line 11, Change "time" to --time.--.

Column 19 at line 64, Change "I-sigma" to --1-sigma--.

Column 20 at line 27, Change "gates" to --gates.--.

Column 20 at line 44, Change "sacrifying" to --sacrificing--.

Column 28 at line 41, Change "bidirectional" to --bi-directional--.

Signed and Sealed this
Twenty-fourth Day of June, 2014

Michelle K. Lee
*Deputy Director of the United States Patent and Trademark Office*